(12) United States Patent
Tagami et al.

(10) Patent No.: US 8,198,730 B2
(45) Date of Patent: Jun. 12, 2012

(54) SEMICONDUCTOR DEVICE AND METHOD OF MANUFACTURING THE SAME

(75) Inventors: Masayoshi Tagami, Tokyo (JP); Yoshihiro Hayashi, Tokyo (JP); Munehiro Tada, Tokyo (JP); Takahiro Onodera, Tokyo (JP); Naoya Furutake, Tokyo (JP); Makoto Ueki, Tokyo (JP); Mari Amano, Tokyo (JP)

(73) Assignee: NEC Corporation, Tokyo (JP)

( * ) Notice: Subject to any disclaimer, the term of this patent is extended or adjusted under 35 U.S.C. 154(b) by 242 days.

(21) Appl. No.: 12/522,814

(22) PCT Filed: Jan. 8, 2008

(86) PCT No.: PCT/JP2008/050309
§ 371 (c)(1),
(2), (4) Date: Jul. 27, 2009

(87) PCT Pub. No.: WO2008/084867
PCT Pub. Date: Jul. 17, 2008

(65) Prior Publication Data
US 2010/0096756 A1 Apr. 22, 2010

(30) Foreign Application Priority Data

Jan. 10, 2007 (JP) ................................ 2007-002911
May 30, 2007 (JP) ................................ 2007-144282
Nov. 13, 2007 (JP) ................................ 2007-293912

(51) Int. Cl.
*H01L 23/52* (2006.01)
(52) U.S. Cl. ......... 257/762; 257/E23.141; 257/E21.584; 438/648; 438/650

(58) Field of Classification Search .................. 257/750, 257/751, 761, 763, E29.157; 438/637, 648
See application file for complete search history.

(56) References Cited

U.S. PATENT DOCUMENTS

| 6,091,099 A * | 7/2000 | Kiyotoshi et al. | 257/310 |
| 6,284,013 B1 * | 9/2001 | Shindo et al. | 75/10.28 |
| 6,787,912 B2 * | 9/2004 | Lane et al. | 257/762 |
| 6,869,867 B2 * | 3/2005 | Miyashita et al. | 438/586 |

(Continued)

FOREIGN PATENT DOCUMENTS

CN 1708845 A 12/2005

(Continued)

OTHER PUBLICATIONS

Chinese Office Action for CN200880001355.5 issued Jun. 29, 2010.

(Continued)

*Primary Examiner* — Thao Le
*Assistant Examiner* — Sheng Zhu

(57) ABSTRACT

A semiconductor device has a multilayer interconnection including a copper interconnection film formed in a predetermined area within an insulating film, a liner film, and a high-melting-point metal film. The copper interconnection film is polycrystalline, and crystal grains occupying 40% or more of an area of a unit interconnection surface among crystal grains forming the polycrystal are oriented to (111) in a substrate thickness direction. The copper interconnection film has crystal conformity with the noble metal liner film. In a case where the high-melting-point metal film is formed of Ti and the noble metal liner film is a Ru film, the high-melting-point metal of Ti dissolves into Ru in a solid state to form the noble metal liner. Thus, a copper interconnection is formed with both of Cu diffusion barrier characteristics and Cu crystal conformity.

20 Claims, 18 Drawing Sheets

U.S. PATENT DOCUMENTS

| | | | |
|---|---|---|---|
| 7,279,423 B2 * | 10/2007 | Johnston et al. | 438/687 |
| 2005/0124154 A1 * | 6/2005 | Park et al. | 438/643 |
| 2007/0152342 A1 * | 7/2007 | Tsao et al. | 257/774 |
| 2008/0020934 A1 * | 1/2008 | Yoshii et al. | 505/100 |
| 2008/0237860 A1 * | 10/2008 | Ishizaka et al. | 257/751 |
| 2009/0087339 A1 * | 4/2009 | Shinriki | 420/462 |

FOREIGN PATENT DOCUMENTS

| | | | |
|---|---|---|---|
| JP | 2000331333 | * | 11/2000 |
| JP | 2002075994 A | | 3/2002 |
| JP | 2004031866 A | | 1/2004 |
| JP | 2006120870 A | | 5/2006 |
| JP | 2006269623 A | | 10/2006 |

OTHER PUBLICATIONS

International Search Report for PCT/JP2008/050309 mailed Apr. 8, 2008.

* cited by examiner

| | | DIRECT PLATING ON LESS-ORIENTED Ru FILM | DIRECT PLATING ON HIGHLY-ORIENTED Ru FILM | PLATING ON SEED Cu |
|---|---|---|---|---|
| AREA FRACTION OF EACH ORIENTATION | <111>[001] | 0.206 | 0.726 | 0.785 |
| | <511>[001] | 0.143 | 0.125 | 0.100 |
| | <100>[001] | 0.083 | 0.024 | 0.003 |
| | <211>[001] | 0.137 | 0.061 | 0.077 |
| | <212>[001] | 0.229 | 0.041 | 0.017 |
| | <201>[001] | 0.106 | 0.010 | 0.009 |
| CRYSTAL ORIENTATION MAP | ONLY PORTIONS HAVING (111) ORIENTATION ARE BLACK-COLORED | | | |

|  | LESS-ORIENTED Ru LINER | | HIGHLY-ORIENTED Ru LINER Ru(002) | | Cu SEED/Ta LINER | |
| --- | --- | --- | --- | --- | --- | --- |
|  | NO PATTERN | 0.2/0.2 μm | NO PATTERN | 0.2/0.2 μm | NO PATTERN | 0.2/0.2 μm |
| MEAN PARTICLE DIAMETER (AREA) | 0.573 μm | 0.241 μm | 0.792 μm | 0.256 μm | 1.265 μm | 0.283 μm |
| AREA FRACTION OF CU(111) | 20.6% | 24.0% | 72.6% | 43.3% | 78.5% | 49.4% |
| CRYSTAL ORIENTATION MAP (Normal Direction) |  |  |  |  |  |  |

SEMICONDUCTOR DEVICE AND METHOD OF MANUFACTURING THE SAME

TECHNICAL FIELD

The present invention relates to a semiconductor device having a multilayer interconnection structure, and more particularly to a semiconductor device having a multilayer interconnection structure including a trench interconnection (damascene interconnection) containing copper as a principal component and a method of manufacturing the same.

BACKGROUND ART

Heretofore, aluminum (Al) or Al alloy has widely been used as a conductive material in silicon semiconductor integrated circuits (LSI). As manufacturing methods of LSIs make progress in fineness, copper (Cu) has increasingly been used as a conductive material to reduce the wiring resistance of interconnections and to enhance the reliability of interconnections. Cu readily diffuses into a silicon oxide film. Accordingly, a conductive barrier metal film for preventing diffusion of Cu is used on side surfaces and lower surfaces of Cu interconnections, and an insulating barrier film is used on upper surfaces of Cu interconnections. Ta or Ti, or nitrides thereof, or multilayer films thereof have been used for a barrier metal film. In order to form a Cu interconnection, there has been employed a method of pre-forming an interconnection trench (damascene trench) inside of an insulating film by dry etching and then depositing a barrier metal in the trench by a sputtering method or the like. Subsequently, a Cu layer is formed on the barrier metal by a sputtering method, and Cu is embedded into the trench by an electroplating method using the Cu layer as a seed layer (hereinafter referred to as the conventional Cu interconnection technique). Then excessive barrier metal and Cu are removed by CMP (chemical mechanical polishing) technology, thereby forming a Cu interconnection.

A Ta film or a Ta/TaN multilayer film has been put into a practical use as a barrier metal film. However, the crystal lattice unconformity between the Cu seed layer (111) and the Ta barrier metal film (110) is as high as 22%. Accordingly, a problem that the resistivity of copper is increased by electron scattering due to crystal defects at a Cu/Ta interface has become significant along with the development of the interconnection fineness.

Furthermore, the fineness in interconnection dimension has developed to dimensions of 100 nm or less in recent years. Accordingly, a method of forming a Cu seed layer by a sputtering method has difficulty in embedding Cu without generation of voids because the side coverage of a Cu film formed on sidewalls of a trench tends to be insufficient. Moreover, a Cu seed layer needs to be formed thinly in fine trenches and vias. However, there is a problem that a thinly formed Cu film is likely to cohere. Accordingly, a direct plating method, in which plating is conducted without forming a Cu seed layer on a barrier metal, has been examined for use. In order to implement such a direct plating method using no Cu seed layer, some technology is required to maintain a low resistivity of what is called a barrier metal layer and to conduct electric-field plating with high uniformity. Furthermore, in a direct plating method, a surface of a barrier metal is exposed directly to the atmosphere or a plating liquid. Thus, a barrier metal needs to have a high oxidation resistance. Accordingly, there has been examined use of a noble metal material, such as Ru, which has a lower resistivity and higher oxidation resistance as compared to conventionally-used materials such as Ta, Ti, and nitrides thereof. With regard to a direct plating method on a noble metal film, Japanese laid-open patent publication No. 2006-120870 (Patent Document 1) discloses a method of forming a conductive film that is insoluble in an electrolytic plating liquid for deposition of an interconnection material, on a surface of a substrate having recesses for interconnections formed in an insulating film, and depositing the interconnection material on a surface of the conductive film while embedding the interconnection material in the recesses for the interconnections by an electroplating method using the conductive film as a seed film. Here, the conductive film that is insoluble in an electrolytic plating liquid includes one of palladium, rhodium, and ruthenium. On the other hand, with regard to a method of employing a noble metal liner film in the conventional Cu interconnection technique, Japanese laid-open patent publication No. 2002-075994 (Patent Document 2) discloses a technique of using Ru or an oxide thereof as a barrier metal. Japanese laid-open patent publication No. 2004-31866 (Patent Document 3) discloses a technique of using a multilayer film of Ru or a nitride thereof as a barrier metal in order to prevent diffusion of Cu and improve the adhesion with Cu.

DISCLOSURE OF INVENTION

Problem(s) to be Solved by the Invention

However, the following problems arise with respect to a method of forming an interconnection by a direct plating method without forming a Cu seed layer on a barrier metal.

Generally, a Cu film being plated grows based on (111) orientation of a seed Cu film. Accordingly, Cu interconnections tend to have (111) orientation. This orientation advantageously improves the migration resistance of Cu. However, if plating growth is developed without use of a Cu seed layer, the degree of (111) orientation is lowered in Cu as compared to the case using a Cu seed layer. Thus, it has been desired to develop a technique to enhance the degree of (111) orientation in Cu.

The inventors have found that use of a Cu seed layer so as to improve the degree of (111) orientation in Cu often involves exaggerated grain growth of Cu and causes larger variations in particle diameter of Cu. In other words, such variations in particle diameter cause variations in reliability of Cu interconnections, thereby degrading the reliability of Cu interconnections. Accordingly, it has been desired to develop an interconnection formation method that can maintain variations (standard deviation) in particle diameter of Cu at a low level and can improve the degree of the orientation in Cu. Particularly, a liner film having high crystal conformity with a Cu seed layer (111) has been expected.

When a noble metal film formed of Ru or the like is used as a liner film, it needs to combine with an amorphous high-melting-point metal having a barrier characteristic so as to form a multilayer structure because the noble metal film formed of Ru or the like has no Cu barrier characteristics. In this case, there is a problem that the crystallinity of the noble metal film formed of Ru or the like is further degraded. Thus, a Cu film grown on such a multilayer structure by a plating method suffers from problems that the degree of (111) orientation is further decreased and that the reliability of the interconnections is lowered.

Furthermore, the inventors have found a problem that a polishing rate in a CMP method is considerably lowered if the crystallinity of a noble metal film formed of Ru or the like is degraded. Thus, when an interconnection is formed by a damascene method using a direct plating method using a noble metal film formed of Ru or the like, it is necessary to improve the orientation of the noble metal film formed of Ru or the like so as to ensure a satisfactory polishing rate.

Additionally, it is uncertain how much degree of (111) orientation should preferably be maintained in C in order to prevent the interconnection reliability of Cu from being deteriorated. Thus, it is not clear what ratio of (111) orientation is required in a direct plating method using a noble metal film formed of Ru or the like.

In order to establish connection to a lower-layer interconnection with less resistance, the conventional copper interconnection technique has employed a method of removing a barrier metal on a bottom of a via by a re-sputtering method so as to provide a via connection without the barrier metal. However, the inventors have found that, if this method is applied to a direct plating method using no Cu seed layer, Cu at a lower portion of a via is problematically eluted during plating. Thus, it is necessary to implement a method of providing a low-resistance via connection in a direct plating method using a noble metal film formed of Ru or the like.

The present invention has been made in view of the above problems. It is, therefore, an object of the present invention to provide a semiconductor device having a multilayer interconnection including an interconnection film which can improve the degree of orientation in Cu of the interconnection film in the multilayer interconnection structure such as a damascene interconnection, can reduce variations in a particle diameter distribution, and can thus enhance the reliability of the device.
Means to Solve the Problems A semiconductor device according to the present invention has an insulating film formed above a semiconductor substrate, an interconnection film containing copper as a principal component and being formed in a predetermined area within the insulating film, and a liner film in contact with the interconnection film, and has a multilayer interconnection including at least one layer formed of the interconnection film. The semiconductor device is characterized in that the interconnection film containing copper as a principal component is a polycrystalline film including crystal grains oriented to (111) in a substrate thickness direction, and the liner film is a noble metal film having oxidation resistance under normal pressure and temperature and being oriented so as to have a close-packed orientation surface on its face.

Another semiconductor device according to the present invention has an insulating film formed above a semiconductor substrate, an interconnection film containing copper as a principal component and being formed in a predetermined area within the insulating film, and a liner film in contact with the interconnection film, and has a multilayer interconnection including at least one layer formed of the interconnection film. The semiconductor device is characterized in that the interconnection film containing copper as a principal component is polycrystalline, crystal grains occupying 40% or more of an area of a unit interconnection surface among crystal grains forming the polycrystal are oriented to (111) in a substrate thickness direction, a standard deviation of diameters of the crystal grains is 0.5 μm or less, and the liner film is a noble metal film having oxidation resistance under normal pressure and temperature and being oriented so as to have a close-packed orientation surface on its face.

Furthermore, it is preferable to form a high-melting-point metal film between the liner film and the insulating film.

Moreover, in a multilayer structure of the liner film formed of the noble metal film oriented so as to have a close-packed orientation surface on its face and the high-melting-point metal film, a solid solution layer of the high-melting-point metal film that dissolves in the noble metal film in a solid state is preferably formed at least in an interface area.

Furthermore, it is preferable to form the liner film of the noble metal film having oxidation resistance under normal pressure and temperature at a via bottom of the multilayer interconnection, and form a high-melting-point metal film between the liner film and the insulating film at a portion other than the via bottom.

Moreover, for example, the liner film may be a Ru film oriented so as to have a close-packed orientation surface on its face.

Furthermore, for example, the liner film may contain C therein as an impurity at 100 ppm or less.

Moreover, for example, the liner film may contain, as an additive component, at least one element selected from the group consisting of Al, Pt, Pd, Ag, and Ni.

Meanwhile, the high-melting-point metal film may contain, as a principal component, at least one element selected from the group consisting of Ta, Ti, W, Ru, Si, Mn, Zr, and Hf.

Preferably, a principal component of the high-melting-point metal film dissolves in at least a portion of the liner film in a solid state. Additionally, a principal component of the high-melting-point metal film preferably dissolves in an entire surface of the liner film in a solid state and diffuses to the interconnection film containing copper as a principal component.

Furthermore, the high-melting-point metal film preferably contains nitrogen. For example, the high-melting-point metal film may be amorphous.

A method of manufacturing a semiconductor device according to the present invention is characterized by comprising: a step of forming a trench and/or a via for an interconnection in a predetermined area of an insulating film formed above a semiconductor substrate; a step of forming a high-melting-point metal film on the insulating film having the trench and/or the via formed therein; a step of forming a noble metal film on the high-melting-point metal film under an atmosphere of 2 mTorr or less with a sputtering method; and a step of forming a film containing copper as a principal component on the noble metal film.

In this case, the film containing copper as a principal component may be formed by a plating method in the step of forming the film containing copper as a principal component.

Furthermore, the noble metal film is preferably oriented so as to have a close-packed orientation surface on its face.

Moreover, the noble metal film is preferably a Ru film oriented so as to have a close-packed orientation surface on its face.

Furthermore, for example, the noble metal film may contain, as an additive component, at least one element selected from the group consisting of Al, Pt, Pd, Ag, and Ni.

Meanwhile, the high-melting-point metal film preferably contains, as a principal component, at least one element selected from the group consisting of Ta, Ti, W, Ru, Si, Mn, Zr, and Hf.

Furthermore, the high-melting-point metal film preferably contains nitrogen.

Moreover, the high-melting-point metal film is preferably amorphous.

Preferably, only the high-melting-point metal at a bottom of the via is selectively removed by a re-sputtering method after the high-melting-point metal has been formed; and the noble metal film is then formed.
Effect(s) of the Invention According to the present invention, by forming an interconnection film containing copper as a principal component and having a high degree of (111) orientation in Cu and small variations in a crystal particle diameter distribution, it is possible to suppress the migration of copper, extend the lifetime of the device, and reduce variations in performance. Therefore, it is possible to provide a semiconductor device having copper interconnections having a long lifetime, small variations in interconnection performance, and high reliability.

BEST MODE FOR CARRYING OUT THE INVENTION

Figure 1:
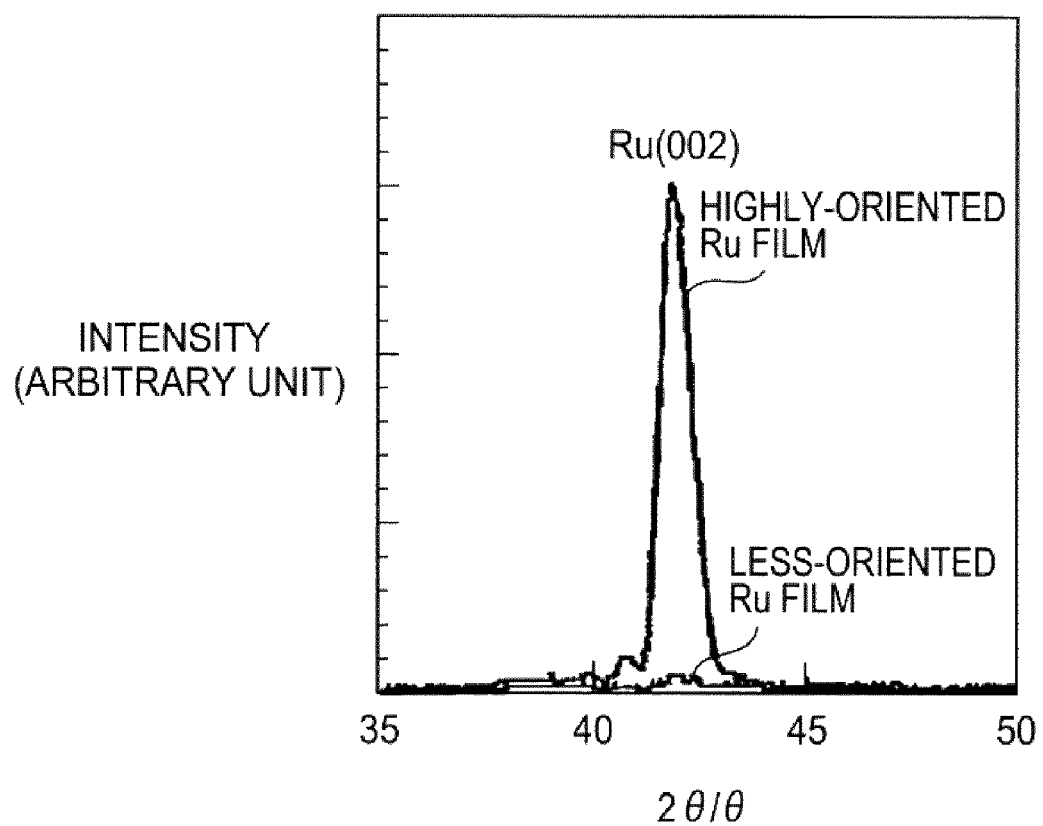
FIG. 1 is a graph showing XRD spectra of a general Ru film (less-oriented Ru film) formed on an amorphous TaN film and a highly-oriented Ru film formed by a low-pressure sputtering.

The inventors have found that a highly-oriented noble metal film formed of Ru or the like by a low-pressure sputtering can improve the degree of (111) orientation in a direct-plated Cu film formed on the highly-oriented noble metal film and can reduce variations in crystal particle diameter, which have been problematic in a conventional plating process using a Cu seed, to thereby form an interconnection with reliability equivalent to or higher than that of a Cu interconnection film formed by a conventional Cu interconnection formation technique. Furthermore, the inventors have found that the crystal lattice conformity can also be improved in a Cu seed film grown by sputtering on a highly-oriented noble metal film formed of Ru or the like with a low-pressure sputtering. In either case, electron scattering is suppressed at an interface between Cu and a highly-oriented noble metal film, so that a copper interconnection having a low resistance can be obtained.

In order to strengthen the orientation, deposition of a noble metal film is performed under a low pressure. Thus, it is preferable to use a sputtering method for deposition of the noble metal film. A noble metal film formed by a CVD method (Chemical Vapor Deposition) or an ALD method (Atomic Layer Deposition) cannot achieve satisfactory orientation. While a noble metal film formed by a CVD method or an ALD method includes C therein as an impurity at more than 100 ppm, a sputter film includes C at less than 100 ppm. Because a carbon impurity deteriorates the crystallinity of a liner film, a liner film should preferably include a carbon impurity as little as possible. This does not apply to metal additives to the noble metal liner film, such as Pt, Pd, Ag, and Ni. The inventors have examined and found that use of a highly-oriented noble metal film formed by a low-pressure sputtering under 2 mTorr or less can enhance the degree of (111) orientation in a direct-plated Cu film formed on the highly-oriented noble metal film, and that variations in crystal particle diameter can be reduced with a high degree of Cu(111) orientation in the direct-plated film formed on the noble metal film that has been controlled in crystal.

In order to grow a Cu film on a noble metal film by direct plating, the noble metal film should preferably have oxidation resistance under normal pressure and temperature. A surface of the liner film is exposed to an atmosphere and a plating liquid so as to cause oxidation. Such oxidation may deteriorate adhesion between Cu and the liner film. In this regard, when the noble metal film has oxidation resistance under normal pressure and temperature, such deterioration of adhesion is not caused. Furthermore, in order to use the noble metal film as a liner film for an interconnection, the noble metal film should preferably have low solid-solubility in Cu. In view of the above discussion, it is preferable to use Ru as the liner film.

Although conventional plating on a seed can provide a high degree of Cu(111) orientation, crystal grains may partially grow to a large extent. Therefore, the conventional plating on a seed problematically has large variations in particle diameter. On the other hand, when a conventional noble metal film is used as a liner film, the noble metal film should be used in a multilayer structure combined with an amorphous high-melting-point metal film having barrier characteristics because the noble metal film has no Cu barrier characteristics. In such a case, however, the crystallinity of the noble metal film is lowered, so that a Cu film grown on the multilayer structure film by a direct plating method will have a lowered degree of (111) orientation.

Furthermore, there is a problem that a noble metal film formed of Ru or the like that has lowered crystallinity exhibits an extremely lowered polishing rate in CMP. Therefore, when an interconnection is to be formed by a damascene method with a direct plating method using a noble metal film formed of Ru or the like, the orientation of the noble metal film formed of Ru or the like should be improved so as to attain a satisfactory polishing rate.

However, according to a method of the present invention, two problems of variations in particle diameter, which would be problematic in plating on a seed, and of a lowered degree of Cu(111) orientation, which would be problematic in use of a noble metal liner, can be solved at the same time, so that a Cu interconnection can be formed with high reliability. Furthermore, according to a method of the present invention, the orientation of a noble metal film formed of Ru or the like is improved so as to attain a satisfactory CMP rate.

Thus, a Cu interconnection can be formed with high reliability and small performance variations by forming the interconnection with use of a Cu film having a high area fraction of (111) orientation and small variations in crystal particle diameter.

FIG. 1 shows XRD (X-ray Diffraction) spectra of a Ru film formed on an amorphous TaN film under general conditions (hereinafter referred to as a less-oriented Ru film) and a Ru film formed on an amorphous TaN film by sputtering under a low-pressure atmosphere (hereinafter referred to as a highly-oriented Ru film). The Ru film formed under general conditions had a low degree of (002) orientation, with which Ru has a close-packed orientation surface on its face, because it was formed on an amorphous TaN film. The highly-oriented Ru film formed by sputtering under a low-pressure atmosphere showed that a spectrum having a higher degree of Ru(002) orientation was obtained by crystal control.

Figures 2, 3:
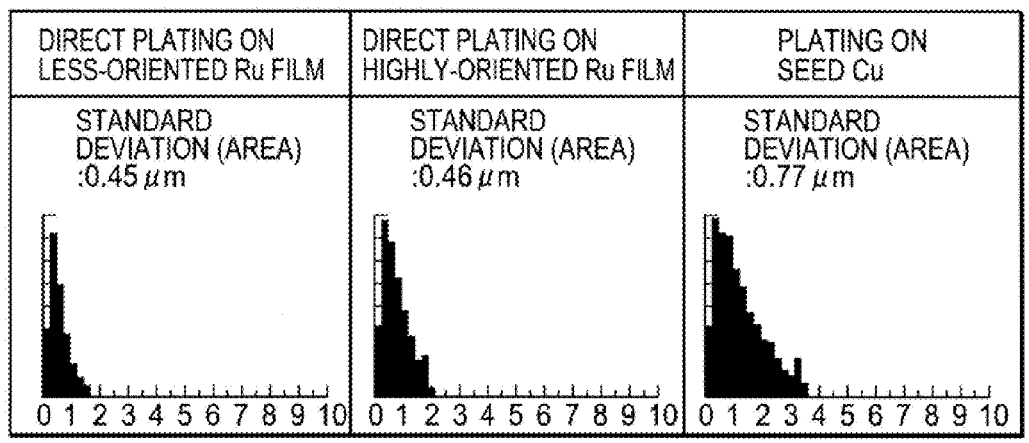
FIG. 2 is a diagram showing EBSD analysis results of Cu films formed on a Ru liner film by direct plating and of a film formed on a seed by a conventional plating technique.
FIG. 3 is a diagram showing crystal particle diameter distributions of Cu films formed on a Ru liner film by direct plating and of a film formed on a seed by a conventional plating technique.

FIG. 2 shows results of analysis with an EBSD (Electron Back Scatter Diffraction Patterns) method on the orientation of a seed-plated Cu film formed by a conventional Cu interconnection technique and plated Cu films formed by a direct plating method using Ru shown in FIG. 1 as a liner film. The upper row shows area fractions of crystal orientations in the substrate thickness direction of the plated Cu films, whereas the lower row shows maps of the crystal orientation of the plated Cu films. The crystal orientation maps are shown such that only portions having (111) orientation are black-colored. Those results show that the plated Cu film on the less-oriented Ru film had weaker Cu(111) orientation as compared to the plated Cu film on the Cu seed and that its area fraction of Cu(111) orientation was less than 50%. On the other hand, the inventors have found from the results of crystal control that, when Cu had been directly plated on the highly-oriented Ru film, the area fraction of Cu(111) orientation was above 70%, so that its orientation was not inferior to that of the conventional plated film on the Cu seed. At the same time, as shown in FIG. 3, the inventors have found that the particle diameter of the Cu film directly plated on the Ru film having a high degree of (111) orientation could be made uniform such that the standard deviation was not more than 0.5 μm.

On the other hand, as shown in FIG. 3, the conventional plating on the seed Cu could provide a high degree of Cu(111) orientation but could not solve a problem of large variations in crystal particle diameter. As can be seen from comparison of the orientations of the Ru films and the plated Cu films, the area fraction of (111) orientation in the Cu film directly plated on the Ru film was increased, as the degree of Ru (002) orientation was higher. Thus, it is apparent that the reliability of a direct-plated Cu interconnection in a semiconductor device is greatly improved when a direct-plated Cu is formed on a Ru film subjected to crystal control. FIG. 2 shows the EBSD analysis results of the Cu film surfaces in a state such that there were no wiring patterns. When the similar evaluation was made on interconnection trenches, the area fractions of Cu(111) orientation in the thickness direction of the substrate were 20.6% for direct plating on a less-oriented Ru film and 43.3% for direct plating on a highly-oriented Ru film. The latter value is equivalent to the value in the case of the plating on the Cu seed.

The lattice unconformity between Cu(111) and Ru(002) was 5.5%, which is ¼ or less of conventional lattice unconformity between Cu(111) and Ta(110), i.e., 26%. Thus, the Cu(111)/Ru(002) liner is superior to the conventional Cu(111)/Ta(110) liner from the view point of reduction of crystal defects at an interface between Cu and a liner. This advantage becomes prominent as a difference in electron scattering under cryogenic temperatures at the interface between Cu and the liner.

Furthermore, the inventors have found that the present invention has another advantage in that an interface between a noble metal film formed of Ru or the like and Cu can be alloyed by adding a trace of a metal element, such as Al, Pt, Pd, Ag, or Ni, to the noble metal film formed of Ru or the like. The alloying of Cu is effective for suppressing the migration of Cu. Thus, it is possible to prevent breaking defects of an interconnection, which would be caused by the migration of Cu. However, the alloying of Cu increases the resistance. Therefore, there is a trade-off between improvement of the reliability and decrease of the speed of the circuit. Accordingly, it is necessary to properly adjust the amount of metal element to be added to Cu. Primary paths for the migration of Cu are on interfaces between Cu and other types of materials. When a metal element added to a noble metal film formed of Ru or the like diffuses into Cu according to the present invention, Cu near an interface with the noble metal film formed of Ru or the like is preferentially alloyed while the amount of Cu added to a portion away from the interface is reduced. Thus, it is possible to avoid a resistance increase more than necessary and to achieve satisfactory effect of migration suppression.

In order to solve the aforementioned problems, a semiconductor device according to a first invention of the present application has an insulating film formed above a semiconductor substrate, an interconnection film containing copper as a principal component and being formed in a predetermined area within the insulating film, and a liner film in contact with the interconnection film, and the semiconductor device has a multilayer interconnection including at least one layer formed of the interconnection film. The interconnection film containing copper as a principal component is a polycrystalline film including crystal grains oriented to (111) in a substrate thickness direction.

Furthermore, a semiconductor device according to a second invention of the present application is configured so that the interconnection film containing copper as a principal component is polycrystalline, that crystal grains occupying 40% or more of an area of a unit interconnection surface among crystal grains forming the polycrystal are oriented to (111) in a substrate thickness direction, and that a standard deviation of diameters of the crystal grains is 0.5 μm or less.

Specific embodiments of the present invention will be described below with reference to the accompanying drawings. Prior to detailed discussion of those embodiments, the meanings of the terms used for the present invention will be described.

The semiconductor substrate refers to a substrate having semiconductor elements such as MOS transistors arranged thereon. The semiconductor substrate includes not only a monocrystalline silicon substrate, but also other types of substrates such as an SOI (Silicon on Insulator) substrate and a substrate for manufacturing a TFT (Thin film transistor) liquid crystal.

The insulating film refers to a film for insulating and isolating interconnection materials. The insulating film may be a film having holes formed therein to reduce the capacity between interconnections. Typical examples of the insulating film include $SiO_2$, an HSQ (Hydrogen Silsesquioxane) film (e.g., Type12™), MSQ (Methyl Silsesquioxane) film (e.g., JSR-LKD™, ALCAP™, NCS™, IPS™, HOSP™), an organic polymer film (SiLK™, Flare™), SiOCH, SiOC (e.g., Black Diamond™, CORAL™, AuroraULK™, Orion™ and the like), an insulating thin film including organic matter in these materials, and a molecular-pore film using cyclic organic silica material. Hereinafter, films having structures in which the above-mentioned films are stacked are also referred to as the insulating film.

An interconnection protective film refers to a material having diffusion barrier characteristics to copper covering a surface of an interconnection. For example, the interconnection protective film may employ at least one of an SiN film, an SiC film, an SiCN film, an SiOC film, an SiOCH film, and a film including organic matter in these materials, a film containing organic matter as a principal component, and a film including SiO in a film containing organic matter as a principal component.

A unit interconnection surface refers to an analysis area in which sufficient information on the orientation and crystal particle diameter distribution of Cu can be obtained to analyze crystal grains of Cu with an EBSD method. In consideration of the distribution of particle diameters of Cu used for general Cu interconnections, an appropriate length of one side of the unit interconnection surface is about 3 μm.

The sputtering method used may be a general sputtering method. For example, a sputtering method having a high directivity, such as a long-throw sputtering method, a collimated sputtering method, or an ionized sputtering method, may be used in order to improve the filling property, the film quality, and the within-wafer uniformity of the film thickness.

The direct plating method refers to a method of plating directly on a liner film or a high-melting-point metal film without pre-forming a seed layer of copper as an electrode inside of an interconnection trench when the trench is to be embedded with copper. Generally, a liner film or a high-melting-point metal film used for an interconnection has a resistance higher than copper and is likely to be oxidized in the atmosphere. Accordingly, if a direct plating method is used, the crystallinity and adhesion of a formed copper film may be inferior to those in a case where plating is conducted on a seed layer.

The noble metal refers to a metal element that is generally rare and has corrosion resistance. The noble metal elements include eight elements of gold (Au), silver (Ag), platinum (Pt), palladium (Pd), rhodium (Rh), iridium (Ir), ruthenium (Ru), and osmium (Os). Among those elements, gold, silver, platinum, palladium, and rhodium produce a complete or nearly complete solid solution with Cu and thus are not suitable for a liner film used for a Cu interconnection. According to the present invention, it is preferable to use Ru or Ir, among the noble metals, or an alloy thereof. While Os may be used, it is not preferred because it has toxicity.

The CMP (Chemical Mechanical Polishing) method is a method of flowing a polishing liquid onto a wafer surface, bringing the wafer surface into contact with a polishing pad being rotated, and polishing the wafer surface to planarize irregularities of the wafer surface which have been produced during a multilayer interconnection formation process. In the interconnection formation with the damascene method, the CMP method is particularly used to remove excessive metal portions and obtain a flat interconnection surface after the metal has been embedded in interconnection trenches or via holes.

The standard deviation of crystal particle diameters of Cu is an index of variations in crystal particle diameter, which is defined by comparison of particle diameters in interconnections having the same width. The mean particle diameter is not calculated based on a mean number diameter of crystal grains, but on a mean area diameter of crystal grains. The crystal grain in the EBSD measurement is defined based on measurement points on the same crystal grain if a misorientation angle between adjacent measurement points is less than 5° or on measurement points on different grains if the misorientation angle is not less than 5°. The crystal particle diameter is defined as an equivalent circle diameter of an identified crystal grain.

Figure 4:
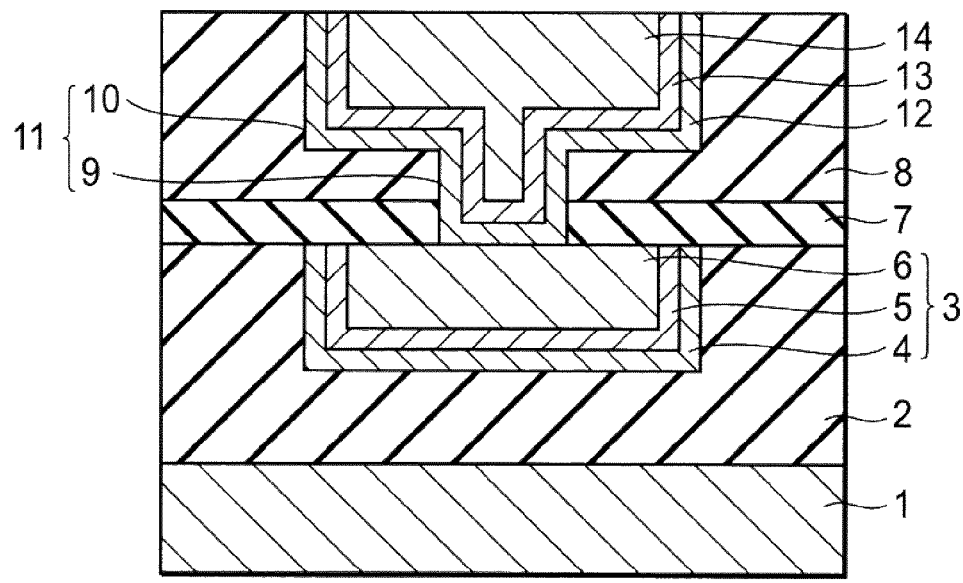
FIG. 4 is a cross-sectional view showing a multilayer interconnection structure of a semiconductor device according to a first embodiment of the present invention.

Next, a semiconductor device according to a first embodiment of the present invention will be described. FIG. 4 is a cross-sectional view showing an interconnection structure of a semiconductor device according to the first embodiment of the present invention. A first insulating film 2 is stacked on a semiconductor substrate 1 on which semiconductor elements have been formed (not shown). A first interconnection 3 is formed inside of the first insulating film 2. The first interconnection 3 is formed within a trench formed on a surface of the first insulating film 2, and includes a first high-melting-point metal film 4 covering a bottom and side surfaces of the trench, a first liner film 5 formed on the first high-melting-point metal film 4, and a first interconnection film 6 containing, as a principal component, copper embedded in an area surrounded by the first liner film 5 (hereinafter referred to as the first copper interconnection film). The first interconnection 3 has an upper surface covered with an interconnection protective film 7. A second insulating film 8 is formed as an upper layer on the interconnection protective film 7. A dual damascene interconnection 11 including a via 9 and a second interconnection 10 is formed in the second insulating film 8. The dual damascene interconnection 11 includes, within trenches of a lower narrow trench provided in the second insulating film 8 and an upper wide trench provided above the narrow trench, a second high-melting-point metal film 12 formed so as to cover inner surfaces of the trenches, a second liner film 13 formed on the second high-melting-point metal film 12, and a second interconnection film 14 containing, as a principal component, copper embedded in an area surrounded by the second liner film 13 (hereinafter referred to as the second copper interconnection film).

Here, each of the first high-melting-point metal film 4 and the second high-melting-point metal film 12 is a film containing, as a principal component, a component selected from the group consisting of Ta, Ti, W, Ru, Si, Mn, Zr, and Hf and has a function of preventing diffusion of copper into the insulating film. Particularly, TaN has excellent diffusion barrier characteristics to copper. Alternatively, it is preferable to use a film of Ta, Ti, W, or TiW, which is a metal that can dissolve in the first high-melting-point metal film 4 in a solid state, or a multilayer film combined with a nitride thereof. For example, when the liner film is formed of Ru and the high-melting-point metal film is formed of Ti, then Ti diffuses at the Ru/Ti interface and dissolves into the Ru liner film in a solid state. The inventors have acquired new findings that this method can suppress Cu diffusion to Ru.

Meanwhile, Ti dissolves in copper in a solid state to some extent. However, the solubility limit is less than 1%. Thus, Ti has a satisfactory function of preventing diffusion of copper to the insulating film. When a material that dissolves in copper in a solid state, such as Ti, is used for the high-melting-point metal film, then the high-melting-point metal film diffuses into the copper interconnection film contacting with a bottom of the via. Therefore, the adhesion of the bottom of the via to the copper interconnection film is improved. Furthermore, alloying of the copper interconnection film produces an effect of suppressing the migration, thereby improving the reliability of the interconnections.

Each of the first liner film 5 and the second liner film 13 is a Ru film, which has (002) main orientation in the thickness direction of the substrate. Preferably, the Ru film is a sputter film formed by a sputtering method in order to enhance the degree of (002) orientation. Each of the first copper interconnection film 6 and the second copper interconnection film 14 is polycrystalline. Crystal grains occupying 40% or more of an area of a unit interconnection surface among crystal grains forming the polycrystal are oriented to (111) in the substrate thickness direction. The standard deviation of diameters of the crystal grains is not more than 0.5 µm.

In a semiconductor device thus configured in the present embodiment, each of the first liner film 5 and the second liner film 13 is a Ru film having (002) main orientation in the thickness direction of the substrate. Therefore, as shown in FIG. 3, the area fraction of (111) orientation in the Cu film directly plated on the Ru film is increased as the degree of the Ru(002) orientation is higher. Accordingly, the first and second copper interconnection films 6 and 14 have remarkably high reliability.

When crystal grains occupying 40% or more of a unit interconnection surface are oriented to (111) in the substrate thickness direction, then the same degree of (111) orientation as that in conventional plating on a seed can be obtained. Furthermore, when the standard deviation of diameters of the crystal grains is not more than 0.5 µm, then it is possible to extend the lifetime of the device as compared to a product using the conventional plating on a seed and to reduce variations in performance. Therefore, it is possible to provide a semiconductor device having copper interconnections having a long lifetime, small variations in interconnection performance, and high reliability.

In the present embodiment, an orientation film according to the present invention is applied to each of the upper layer and the lower layer of the two-layer interconnection. Nevertheless, an orientation film according to the present invention may be applied to only the lower layer or only the upper layer as needed. Furthermore, in the embodiment shown in FIG. 4, the lower-layer interconnection is a single damascene interconnection, and the upper-layer interconnection is a dual damascene interconnection. As a matter of course, however, a multilayer interconnection structure only having one or more single damascene interconnections can also obtain advantages of the present invention.

The structures of a semiconductor device according to the present invention can readily been confirmed in a manufactured semiconductor device. It can be confirmed by evaluating the orientation of a surface of a copper interconnection and a surface of a liner film in a case where a multilayer interconnection is provided at least in a portion of a semiconductor product having a memory circuit such as a DRAM (Dynamic Random Access Memory), an SRAM (Static Random Access Memory), a flash memory, an FRAM (Ferro Electric Random Access Memory), an MRAM (Magnetic Random Access Memory), or a variable resistance memory, or a semiconductor product having a logic circuit such as a microprocessor, or a combination-type semiconductor product on which both of memory and logic circuits are mounted, or an SIP (Silicon in package) in which those semiconductor devices are piled into a plurality of layers. Specifically, the determination can be made by selecting a specific point, exposing the surface of the copper interconnection or the surface of the liner film, and measuring the orientation with an EBSD (Electron Back Scatter Diffraction Patterns) method. In the case of a liner film, a bottom of an interconnection trench is measured.

Figure 5:
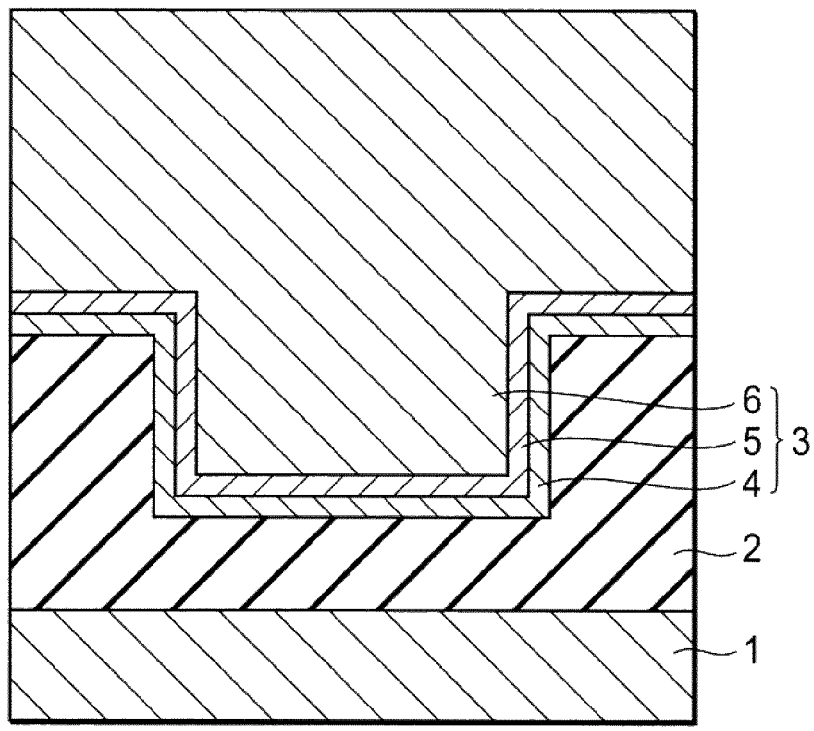
FIG. 5 is a cross-sectional view showing a step of a manufacturing method of a semiconductor device according to the first embodiment of the present invention.

Next, a method of manufacturing a semiconductor device according to the first embodiment will be described specifically with reference to FIGS. 5 to 8. First, as shown in FIG. 5, a first insulating film 2 is deposited on a semiconductor substrate 1 on which semiconductor elements have been formed (not shown). A trench for forming a first interconnection 3 therein is formed in a surface of the first insulating film 2 by etching. Then a first high-melting-point metal film 4 and a first liner film 5 are formed and stacked on the entire surface of the trench including a bottom and side surfaces thereof.

Here, the first high-melting-point metal film 4 is a film having a function of preventing diffusion of copper into the insulating film and containing, as a principal component, a component selected from the group consisting of Ta, Ti, W, Ru, Si, Mn, Zr, and Hf. Particularly, it is preferable to use TaN, which has excellent diffusion barrier characteristics to copper, for the first high-melting-point metal film 4. Alternatively, it is preferable to use a film of Ta, Ti, W, or TiW, which is a metal that can dissolve in the first high-melting-point metal film 4 in a solid state, or a multilayer film combined with a nitride thereof. Furthermore, a sputtering method, a CVD method, an ALD method, and the like may be used to form the first high-melting-point metal film 4. Among other things, a CVD method or an ALD method may be used to improve the coverage for a fine trench.

The first liner film 5 is a noble metal film formed of Ru or the like. Preferably, the noble metal film formed of Ru or the like is a sputter film formed by a sputtering method in order to enhance the degree of the orientation. Particularly, the degree of the orientation can be enhanced by sputtering under a low pressure of 2 mTorr or less. In a specific example of conditions for deposition of the Ru film by sputtering under a low pressure of 2 mTorr or less to enhance the degree of (002) orientation in Ru, a chamber supplied with an Ar gas at 14 sccm may be maintained under a pressure of 1 mTorr, and sputtering may be conducted at 1 kW. As the power used for sputtering is greater, the degree of Ru(002) orientation is enhanced. Nevertheless, the above-mentioned value may be used because the Ru film needs to be formed as a thin film within a fine trench.

Next, a copper interconnection film 6 is formed on the first liner film 5 by a direct plating method. Subsequently, the semiconductor device being manufactured is heated to a temperature in a range of 200° C. to 400° C.

Figure 6:
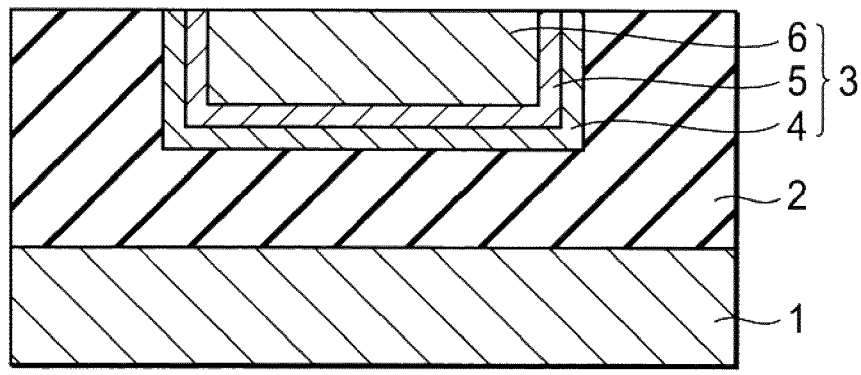
FIG. 6 is a cross-sectional view showing a step subsequent to FIG. 5 in the manufacturing method.

Thereafter, as shown in FIG. 6, the semiconductor device is polished by a CMP method so as to planarize a surface of the semiconductor device, so that excessive copper interconnection film 6, first liner film 5, and first high-melting-point metal film 4 on the first insulating film 2 are removed. Thus, the copper interconnection film 6 is exposed in the trench, thereby forming a flat surface that is flush with the copper interconnection film 2 and on which the first insulating film 2 is exposed. At that time, the planarized first copper interconnection film 6 is a polycrystalline film. Crystal grains occupying 40% or more of an area on a unit interconnection surface among crystal grains forming the polycrystal are oriented to (111) in the substrate thickness direction. The standard deviation of diameters of the crystal grains is not more than 0.5 μm.

In this CMP process, crystal orientation control on the first liner film of a noble metal film is considerably important. For example, a highly-oriented Ru(002) film shown in FIG. 3 maintained a polishing rate of 50 nm/min under polishing conditions having a polishing pressure of 13.8 kPa (2 psi) and wafer/head rotational speeds of 120 rpm/120 rpm. A conventional Ta barrier film exhibited a polishing rate of 38 nm/min under the same conditions. Thus, the polishing rate of the highly-oriented Ru(002) film was equal to or greater than that of the conventional Ta barrier film. Meanwhile, the polishing rate of a less-oriented Ru shown in FIG. 3 was 7 nm/min. It was confirmed that a Ru—Ti alloy in which Ti had dissolved in Ru(002) in a solid state at about 10 ppm to 1% exhibited a polishing rate that was equal to or greater than that of the Ta barrier. Thus, crystal orientation control of the Ru liner film is considerably important not only to improvement of crystal conformity with a Cu film, but also to the CMP process.

In a CMP process, a surface of a metal film is oxidized by an oxidant (such as $H_2O_2$) contained in polishing liquid slurry. The oxidized metal layer is removed by polishing particles. The polishing process proceeds in this manner. An oxidation rate of the less-oriented Ru film becomes non-uniform within the wafer due to the polishing liquid slurry. A polishing rate is controlled on a crystal plane having the lowest oxidation rate. As a result, the polishing rate is conceivably lowered. With the highly-oriented Ru(002) film, the oxidation rate of a surface of Ru by polishing liquid slurry becomes uniform. As a result, it is conceivably possible to obtain a CMP rate that is high enough for practical use.

Figure 7:
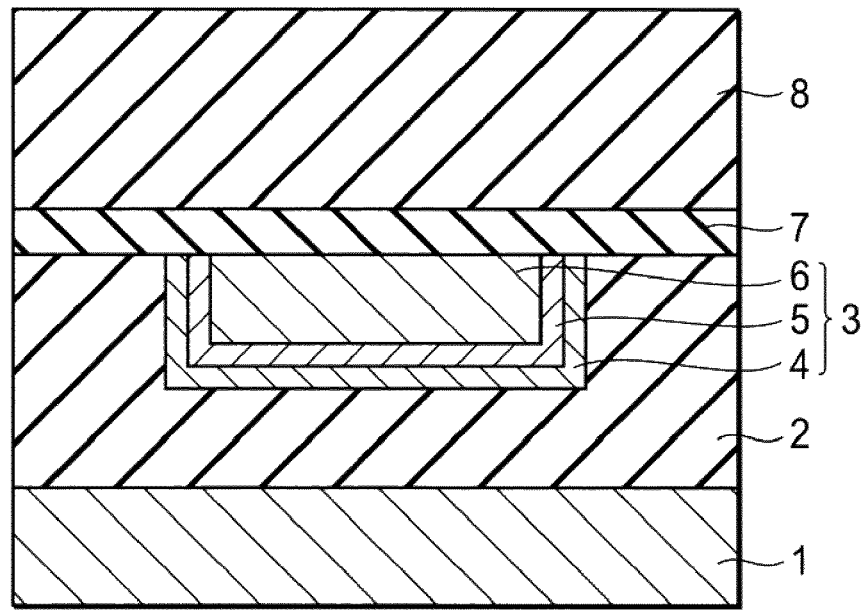
FIG. 7 is a cross-sectional view showing a step subsequent to FIG. 6 in the manufacturing method.
Figure 8:
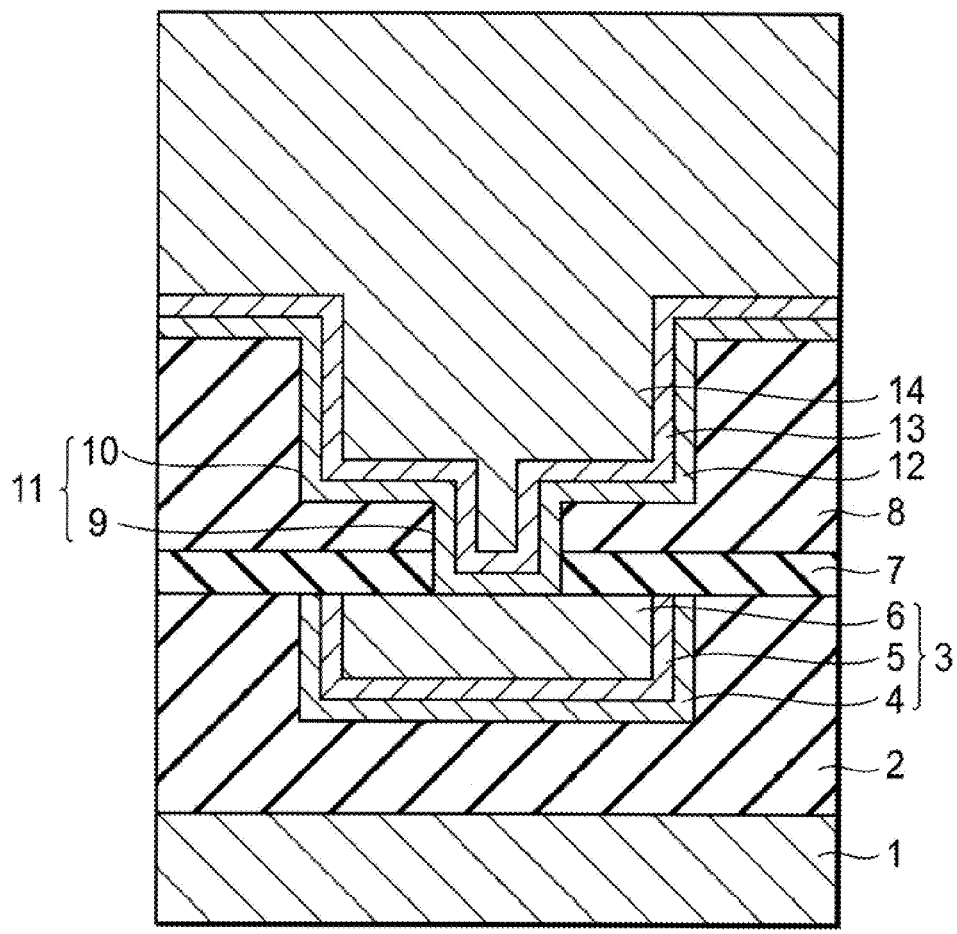
FIG. 8 is a cross-sectional view showing a step subsequent to FIG. 7 in the manufacturing method.

Next, as shown in FIG. 7, an interconnection protective film 7 is formed on the entire surface of the semiconductor device, so that the aforementioned planarized surface is covered with the interconnection protective film 7. Furthermore, a second insulating film 8 is stacked on the interconnection protective film 7. Thereafter, as shown in FIG. 8, a via and a trench, which form a dual damascene interconnection 11 including a via 9 and a second interconnection 10, are formed in the second insulating film 8. Next, a second high-melting-point metal film 12 and a second liner film 13 are formed and stacked on the trench.

Here, the second high-melting-point metal film 12 is a film having a function of preventing diffusion of copper into the insulating film, and a film to which an element selected from the group consisting of Ta, Ti, W, Ru, Si, Mn, Zr, and Hf has been added as a principal component. A sputtering method, a CVD method, an ALD method, and the like may be used to form the second high-melting-point metal film 12. For example, the second high-melting-point metal film 12 may use TaN as with the lower-layer interconnection.

The second liner film 13 is a noble metal film formed of Ru or the like. The noble metal film formed of Ru or the like is preferably a sputter film formed by a sputtering method in order to enhance the degree of the orientation. The deposition conditions for the second liner film 13 are the same as the conditions for the lower-layer interconnection, under which a Ru film having (002) orientation is formed.

A second copper interconnection film 14 is formed on the second liner film 13 by a direct plating method. Subsequently, the semiconductor device being manufactured is heated at temperatures ranging from 200° C. to 400° C.

Next, the entire surface of the semiconductor device is polished by a CMP method to remove the second copper interconnection film 14 and further remove excessive second liner film 13 and second high-melting-point metal film 12 above the second insulating film 8. Thus, a surface of the second insulating film 8 is exposed so as to obtain a planarized surface on which the second copper interconnection film 14 is flush with the second insulating film 8 as shown in FIG. 4.

At that time, the planarized second copper interconnection film 14 is a polycrystalline film. Crystal grains occupying 40% or more of an area on a unit interconnection surface among crystal grains forming a polycrystal are oriented to (111) in the substrate thickness direction. The standard deviation of diameters of the crystal grains is not more than 0.5 μm. Accordingly, the copper interconnection has high reliability.

Figure 9A:
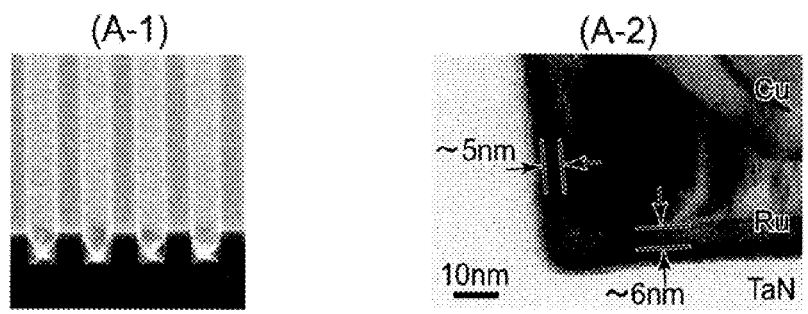
FIG. 9A is a bird's-eye SEM photograph and a cross-sectional TEM photograph modeling copper damascene interconnections according to the first embodiment of the present invention.
Figure 9B:
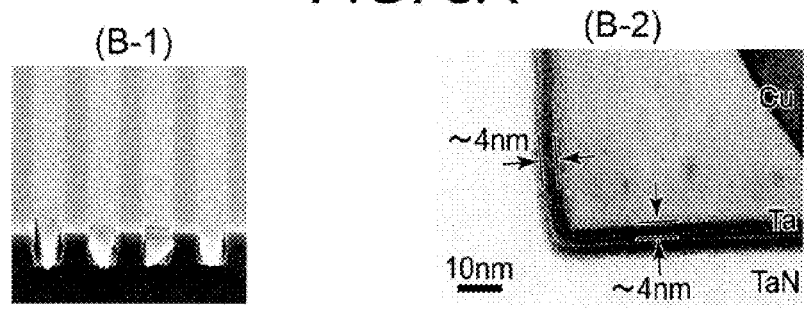
FIG. 9B is a bird's-eye SEM photograph and a cross-sectional TEM photograph modeling conventional copper damascene interconnections.

FIGS. 9A and 9B are SEM (Scanning Electron Microscope) photographs of copper damascene interconnections formed by the aforementioned technique using a highly-oriented Ru liner (Ru(002) orientation film) (FIG. 9A) and of copper damascene interconnections formed by the conventional technique using a Cu seed and a Ta liner (FIG. 9B). TaN was formed as a high-melting-point metal film below the highly-oriented Ru liner film. The film thickness of the highly-oriented Ru liner was 6 nm at the bottom of the interconnection trenches and 5 nm at the sidewalls of the interconnection trenches. Copper damascene interconnections having the same structure were also formed with use of a less-oriented Ru liner film, which is not shown in the drawings. The film thickness of the Ta liner was 5 nm, which was equal to the value in the above case, in the copper damascene interconnections using the Cu seed and the Ta liner.

In order to examine effects on the resistance by electron scattering at an interface, the temperature dependency of the wiring resistance at low temperatures was evaluated. According to the Matthiessen's rule, the resistivity is represented by the sum of the resistance ρi due to impurities or lattice defects and the resistance ρL(T) due to lattice vibration (as shown by the following formula (1)).

$$\rho(T) = \rho i + \rho L(T) \tag{1}$$

Here, ρi is a component that does not depend upon the temperature and is referred to as residual resistance. If T→0K, ρL(T)→0 and the resistance only has residual resistance components. Because almost all part of resistance consist of residual resistance components around 20 K, resistance components caused by interface scattering or grain boundary diffusion can be evaluated by measuring that resistance. The results of comparison of sheet resistances are influenced by the dimension of finished interconnections. Therefore, the sheet resistance was converted to a resistivity value by a Cu cross section of an interconnection having a width of 0.2 μm which had been estimated from a TEM observed image. Such resistivity values were measured in a range of 0 K to 298 K to thereby evaluate the residual resistance. Here, it was assumed that the residual resistance ρi was defined as a resistance at 20 K and that ρL(T) was defined as resistance components having temperature dependency other than the residual resistance.

Figure 10:
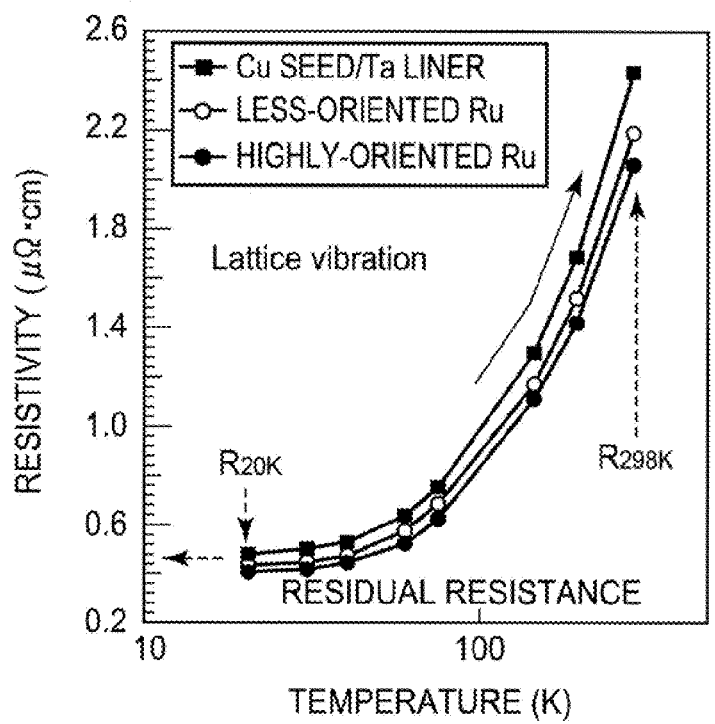
FIG. 10 is a graph showing a relationship between the resistivity and the temperature of copper damascene interconnections.

FIG. 10 shows the resistivity of copper damascene interconnections using a less-oriented Ru liner, a highly-oriented Ru liner, and conventional Cu seed and Ta liner, respectively. As the temperature was lower, changes of the resistivity at the respective levels were smaller with respect to the temperature. Comparison of the resistivities ρi of the respective levels at 20 K reveals that the interconnection using the Ta liner had the highest resistivity and that the interconnection using the highly-oriented Ru liner had the lowest resistivity. Although this tendency is also seen at a room temperature, the differences of the resistivity are larger at a room temperature than the differences at 20 K.

Figure 11:
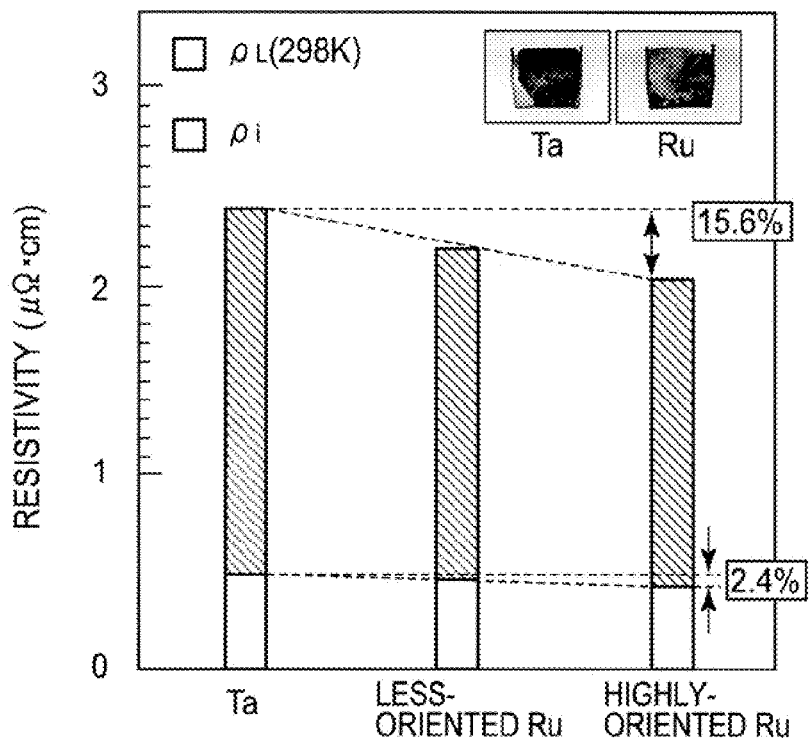
FIG. 11 is a graph showing influences by liner film materials on the resistivity of copper damascene interconnections at a room temperature (298 K).

FIG. 11 shows the resistivity of an interconnection using a Cu seed and a Ta liner and an interconnection using a highly-oriented Ru liner at a room temperature. The total resistivity of the Cu interconnection using the highly-oriented Ru liner (ρi+ρL (298 K)) was lower than that of the Ta level by 15.6%, and ρi was lower than that of the Ta level by 12.4%. The difference of ρi between the Cu seed/Ta liner level and the highly-oriented Ru liner level is equivalent to 2.4% of the total resistivity of the Cu seed/Ta liner level.

Figure 12:
FIG. 12 is a diagram showing influences by liner film materials on the Cu(111) orientation and the crystal particle diameter of copper interconnection films.
Figure 12:
Figure 12:
Figure 12:
Figure 12:
Figure 12:

FIG. 12 shows EBSD analysis results on 0.2-μm-width interconnections along with results on an unprocessed film. As can be seen from FIG. 12, a mean particle diameter and an area fraction of Cu(111) orientation in the 0.2-μm-width interconnection using the highly-oriented Ru liner that had been improved in orientation of Cu were equivalent to those in the interconnection using the Ta liner. Thus, it is conceivable that grain boundary diffusion was substantially equivalent in the case using the highly-oriented Ru liner and the case using the Cu seed and the Ta liner, and that the difference of ρi as seen in FIG. 11 resulted from the interface scattering.

The lattice unconformity between Ru(002) plane and Cu(111) plane can be estimated from the peak angle of the XRD spectrum and the crystal structure to be about 6%, which is about one fourth of the unconformity between Ta(110) plane and Cu(111) plane. Thus, it is conceivable that to use a Ru film that has a higher degree of the lattice conformity than Ta is one of factors to reduce interface scattering and residual resistance components. On the other hand, in the case using the less-oriented Ru liner, the crystal particle diameter was relatively small, and Ru(002) orientation and Cu(111) orientation were weak. Therefore, it is conceivable that the resistance becomes higher than Ta(110) orientation and Cu(111) orientation to some extent.

The aforementioned results are summarized in Table 1 below. It is conceivable that the reduction of the resistivity in a Cu interconnection using a highly-oriented Ru liner at a room temperature can be achieved because of reduction of interface scattering with Cu in addition to a smaller bulk resistance of Ru as compared to Ta. Thus, in order to further reduce interface scattering or grain boundary diffusion in an interconnection using a Ru liner, it proved important to enhance Cu(111) orientation by enhancing Ru(002) orientation to thereby increase the Cu particle diameter.

TABLE 1

|  | Cu seed/ Ta liner | Less-oriented Ru liner | Highly-oriented Ru liner |
|---|---|---|---|
| Resistivity (298 K) ($\mu\Omega \cdot cm$) | 2.45 | 2.20 | 2.07 |
| Resistivity (20 K) ($\mu\Omega \cdot cm$) | 0.484 | 0.441 | 0.424 |
| Cu(111) area (%) | 49.4 | 24.0 | 43.3 |
| Mean particle diameter (μm) | 0.28 | 0.24 | 0.26 |
| TCR (77 to 298 K) ($10^{-3} K^{-1}$) | 3.14 | 3.13 | 3.14 |

The thickness of the highly-oriented Ru liner is not limited to specific values. Nevertheless, the thickness not less than 2 nm was needed to ensure a high degree of Ru(002) orientation in a sputtering method. Therefore, the optimum thickness is in a range of from 2 nm to 20 nm.

With the aforementioned interconnection structure and manufacturing method, it is possible to obtain an interconnection including a copper interconnection film having a high degree of Cu(111) orientation and small variations in a crystal particle diameter distribution. Therefore, it is possible to obtain a semiconductor device including a copper interconnection having a long lifetime, small variations in interconnection performance, and high reliability.

A method of processing a damascene interconnection trench is not limited to the above-described one, and a variety of methods may be used for that purpose.

For example, the first embodiment has described the case where direct Cu plating is conducted on a highly-oriented Ru liner. However, the present invention is not limited to that embodiment. A Cu seed film having (111) orientation may be grown on a highly-oriented Ru(002) liner by a sputtering method, and a Cu plating film may be grown on the Cu seed film. In this case, it is possible to obtain a copper damascene interconnection structure including the Cu(111) film and the Ru(002) liner with good crystal conformity.

Furthermore, the first embodiment has described the case where amorphous TaN is used as the second high-melting-point metal film, which is a Cu diffusion barrier film below the Ru(002) liner. However, the present invention is not limited to that embodiment, and any film may be used as long as it has a function of preventing diffusion of copper into an insulating film. The same advantages can be obtained by using a film containing, as a principal component, one of elements selected from the group consisting of Ta, Ti, W, Mn, Zr, and Hf, or a nitride film thereof, or TiW, TiWN, ZrHf, ZrHfN, TiZr, TiZrN, TiHf, or TiHfN.

Furthermore, a Cu alloy having (111) orientation in which Al, Zr, Mn, Mg, Ti, Sn, or the like has been added may be used as the seed layer. In this case, the additive is doped into a Cu interconnection, so that movement of holes is suppressed in Cu. Therefore, a copper damascene interconnection can be formed with excellent resistance to electromigration (EM) and stress-migration (SM).

Although Ir having (111) orientation with use of a sputtering method may be used as the noble metal liner, the crystal lattice unconformity between Ir(111), which is the close-packed surface of Ir, and Cu(111) is 6%, which is lower than that in the conventional case using Ta. The CMP rate for Ir is lower than that for Ru. Even when Ir is used as the noble metal liner film, (111) orientation can be maintained as long as the film thickness obtained by a sputtering method is not less than 2 nm. Nevertheless, since Ir has a CMP rate lower than Ru, a Ru liner is the most preferable in view of the productivity.

Figure 13:
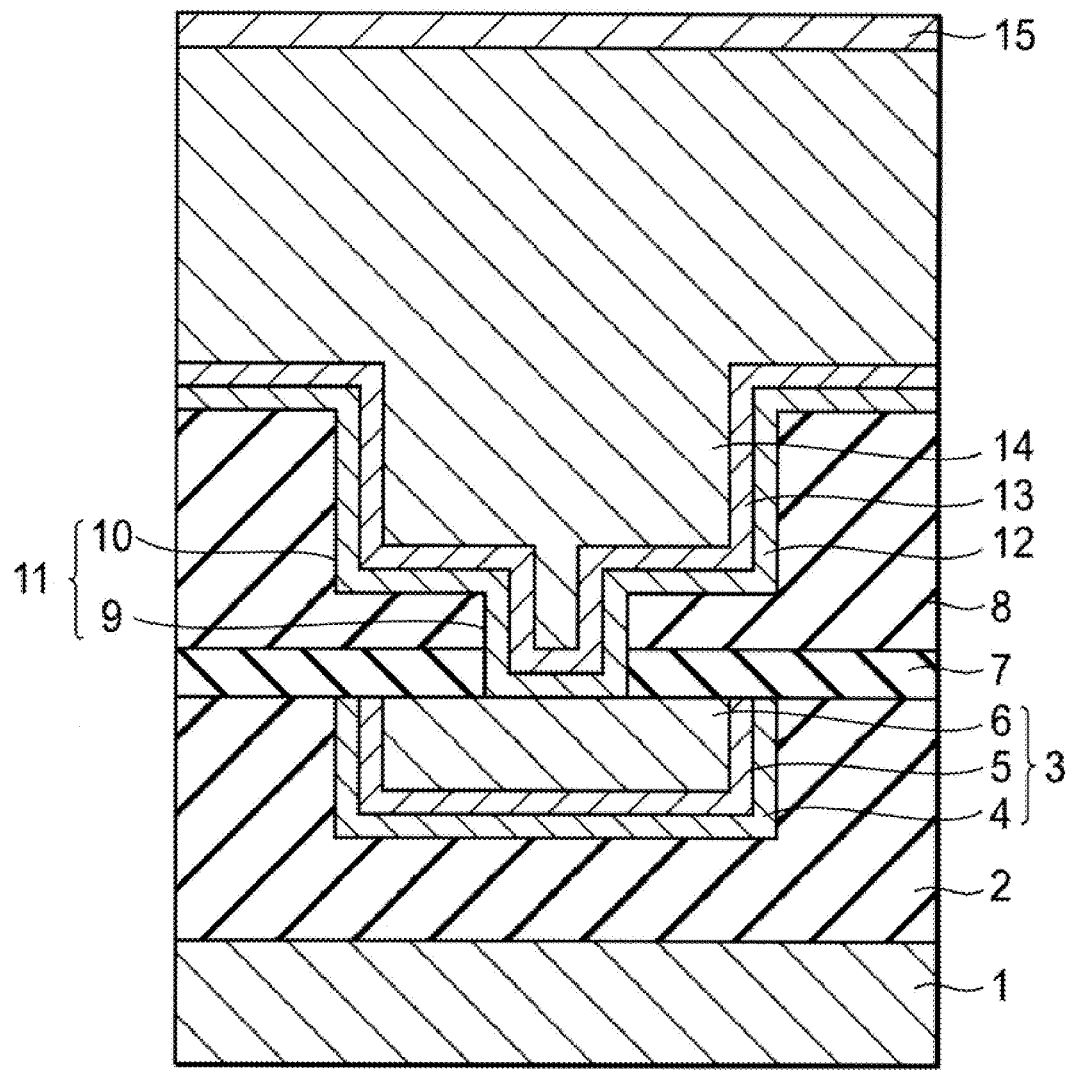
FIG. 13 is a cross-sectional view showing a step of a manufacturing method of a semiconductor device according to a second embodiment of the present invention.

Next, a second embodiment of the present invention will be described with reference to FIG. 13. In the present embodiment, a copper interconnection film is formed by a copper alloy film rather than a copper film. Furthermore, in a method of manufacturing a semiconductor device according to the present embodiment as shown in FIG. 13, a metal film 15 including an element to be added to copper is formed on the surface of the second copper interconnection film 14 subsequently to the process shown in FIG. 8. Then this device is heated at temperatures ranging from 200° C. to 400° C. Thus, the constituent element of the metal film 15 diffuses into the second copper interconnection film 14 to form a copper alloy. For example, when an aluminum film is used as the metal film 15, aluminum diffuses into copper by heating, so that a copper aluminum alloy film is formed. Thereafter, the metal film 15, the second copper interconnection film 14, and excessive second liner film 13, second high-melting-point metal film 12, and second insulating film 8 are removed by CMP to planarize a surface of the device. Thus, it is possible to obtain the second copper interconnection film 14 formed of a copper aluminum alloy.

A copper alloy film has heretofore been used as a seed Cu film for diffusion to a plated Cu film to form a copper alloy interconnection. In the present invention, however, use of the aforementioned metal film 15 facilitates formation of a copper alloy interconnection even if a copper interconnection film is formed by a direct plating method using no seed film.

Figure 14:
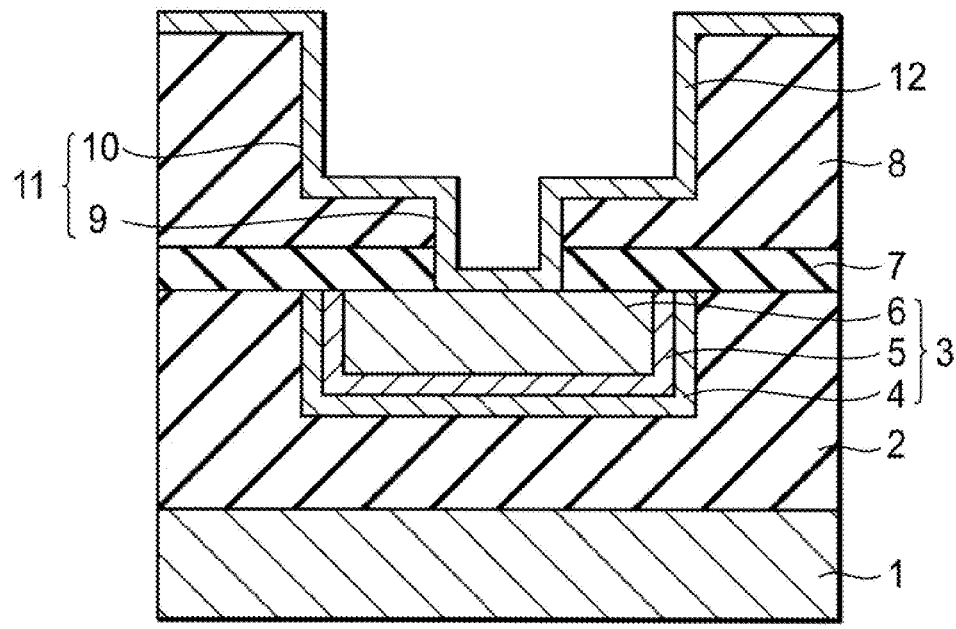
FIG. 14 is a cross-sectional view showing a step of a manufacturing method of a semiconductor device according to a third embodiment of the present invention.
Figure 15:
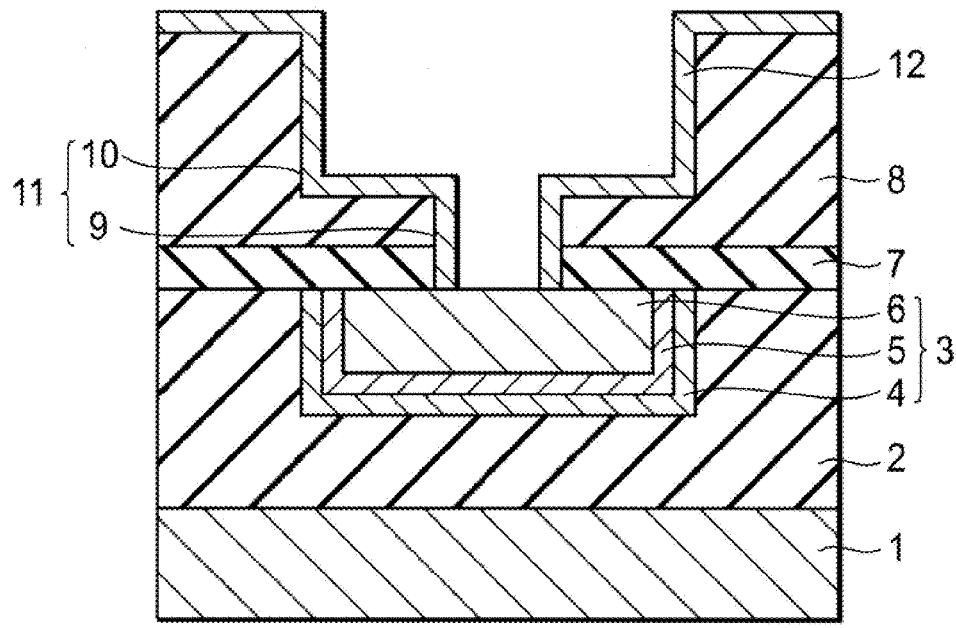
FIG. 15 is a cross-sectional view showing a step subsequent to FIG. 14 in the manufacturing method.

Next, a third embodiment of the present invention will be described with reference to FIGS. 14 to 17. As shown in FIG. 14, a dual damascene interconnection 11 including a via 9 and a second interconnection 10 is formed, then a second high-melting-point metal film 12 is formed. When the second high-melting-point metal film 12 is formed by a sputtering method, a bottom of the via is removed by re-sputtering to thereby expose a first interconnection film 6 as shown in FIG. 15.

Figure 16:
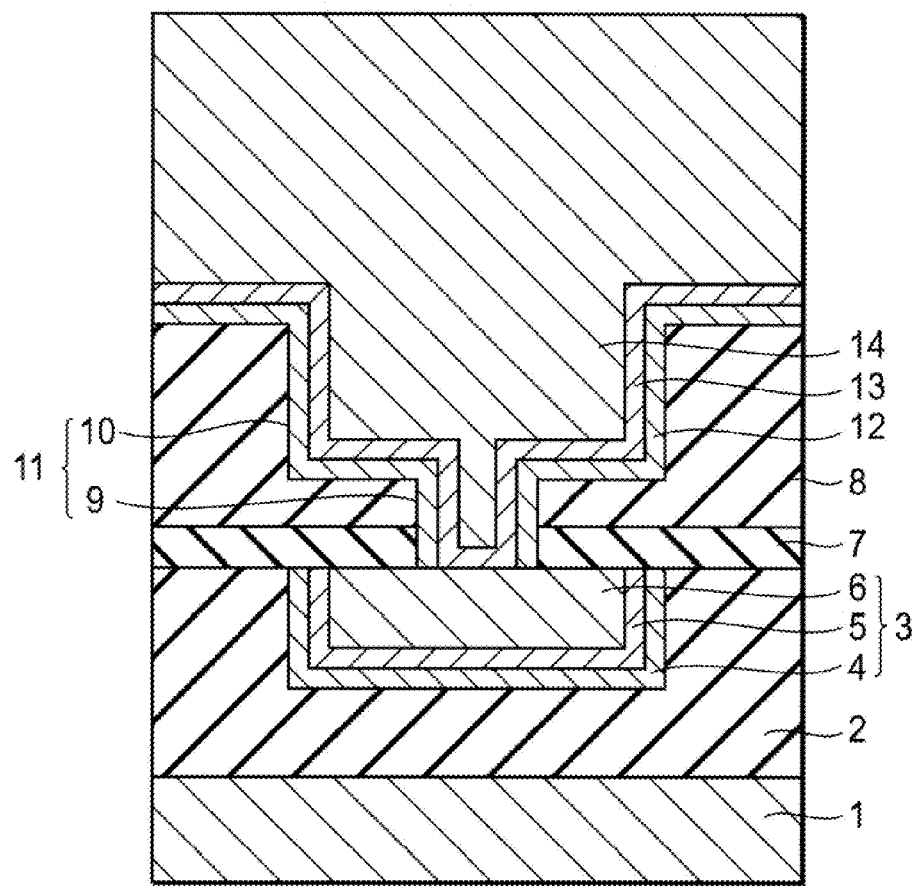
FIG. 16 is a cross-sectional view showing a step subsequent to FIG. 15 in the manufacturing method.

Then, as shown in FIG. 16, a second liner film 13 is stacked thereon, and a second copper interconnection film 14 is formed on the second liner film 13 by a direct plating method. Thereafter, the device is heated at temperatures ranging from 200° C. to 400° C. Here, the second high-melting-point metal film 12 is a film having a function of preventing diffusion of copper into the insulating film and including one component of Ta, Ti, W, Ru, Si, Mn, Zr, and Hf. A sputtering method, a CVD method, an ALD method, and the like may be used to form the second high-melting-point metal film 12. The second liner film 13 is a Ru film, which has (002) main orientation in the thickness direction of the substrate. Preferably, Ru film is a sputter film formed by a sputtering method in order to enhance the degree of (002) orientation.

Figure 17:
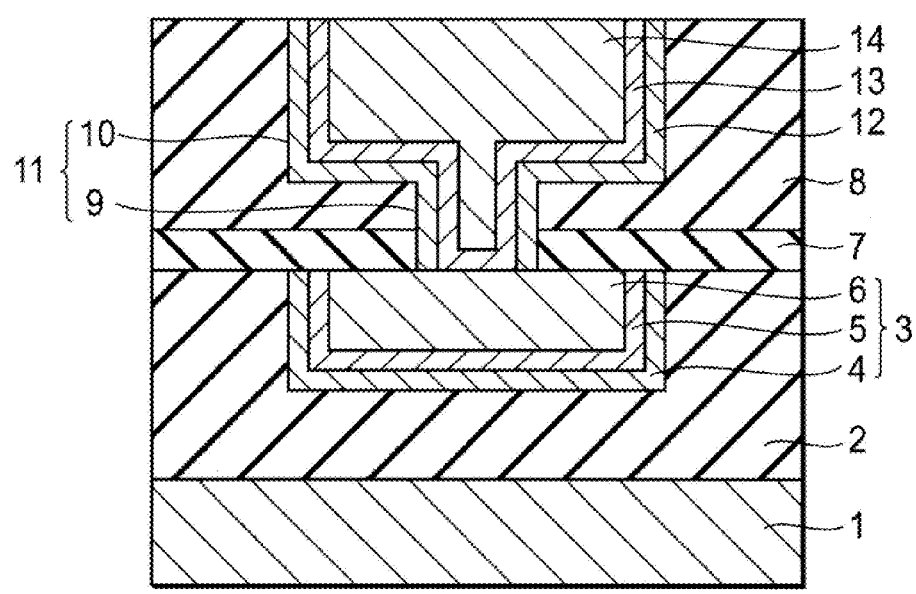
FIG. 17 is a cross-sectional view showing a step subsequent to FIG. 16 in the manufacturing method.

Next, the second copper interconnection film 14 formed by the direct plating method and excessive second liner film 13, second high-melting-point metal film 12, and second insulating film 8 are removed by a CMP method to thereby planarize a surface of the device. Thus, as shown in FIG. 17, a dual damascene interconnection 11 having the second copper interconnection film 14 can be obtained. At that time, the planarized second copper interconnection film 14 is polycrystalline. Crystal grains occupying 40% or more of an area of a unit interconnection surface among crystal grains forming the polycrystal are oriented to (111) in the substrate thickness direction. The standard deviation of diameters of the crystal grains is not more than 0.5 µm. Furthermore, since only the high-melting-point metal film has been removed at the bottom of the via, the via resistance can be reduced without deteriorating Cu(111) orientation.

However, in a case where Cu is embedded by a direct plating method, there is a problem that a plating liquid leaks into an underlying layer if a high-melting-point metal film or a liner film has been made thinner. Therefore, the liner film preferably has a thickness of at least 5 nm at the bottom of the via.

Generally, a noble metal film formed of Ru or the like, which is used for the first liner film, does not have diffusion barrier characteristics to Cu. Therefore, as shown in the first, second, and third embodiments, the high-melting-point metal film is arranged as a barrier film below the noble metal liner film. Nevertheless, if a metal species of the high-melting-point metal film dissolves in the noble metal liner film in a solid state, the noble metal liner film may be changed so as to have Cu diffusion barrier characteristics. In a fourth embodiment, there will be described a specific case in which the first liner film as a noble metal alloy liner is formed of Ru and the high-melting-point metal film is formed of Ti.

Figure 18:
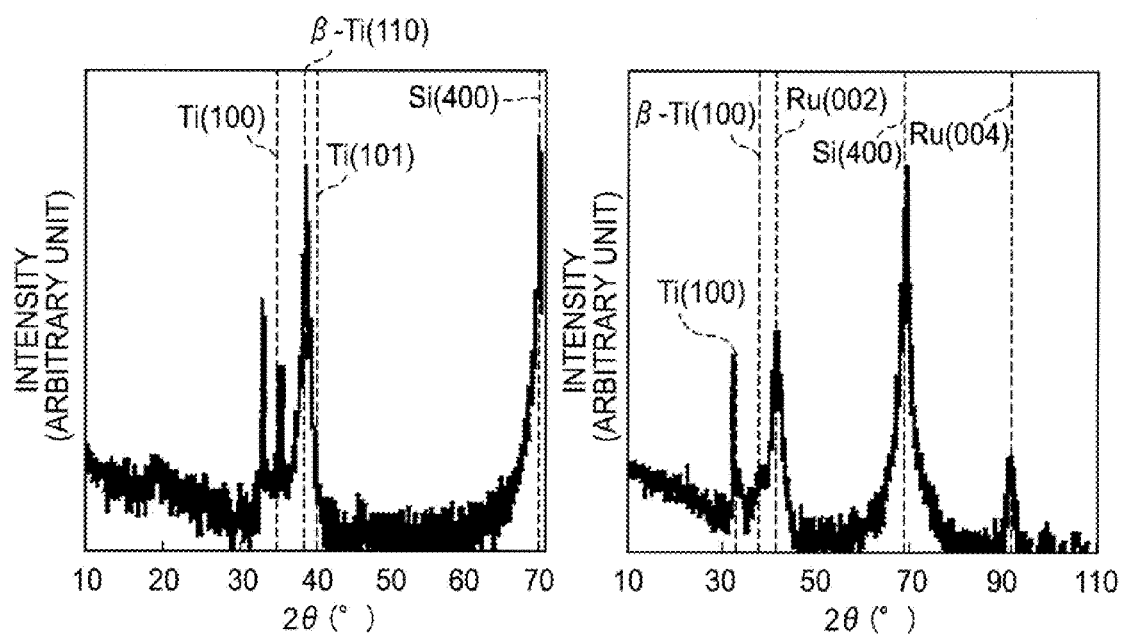
FIG. 18 is X-ray diffraction patterns of a Ti high-melting-point metal film and a multilayer film including a Ru liner and a Ti high-melting-point metal film for a copper damascene interconnection according to the present invention.

FIG. 18 shows XRDs of a multilayer film in which a Ti film was grown as a high-melting-point metal film by sputtering and a Ru liner film was then grown by sputtering. As shown in FIG. 18(a), the Ti film included (100) plane and (101) plane of α phase (hcp) having a principal plane of (011) plane of β phase (bcc). As shown in FIG. 18(b), a Ru liner film grown on the Ti film by a sputtering method had orientation of Ru(002).

Figure 19:
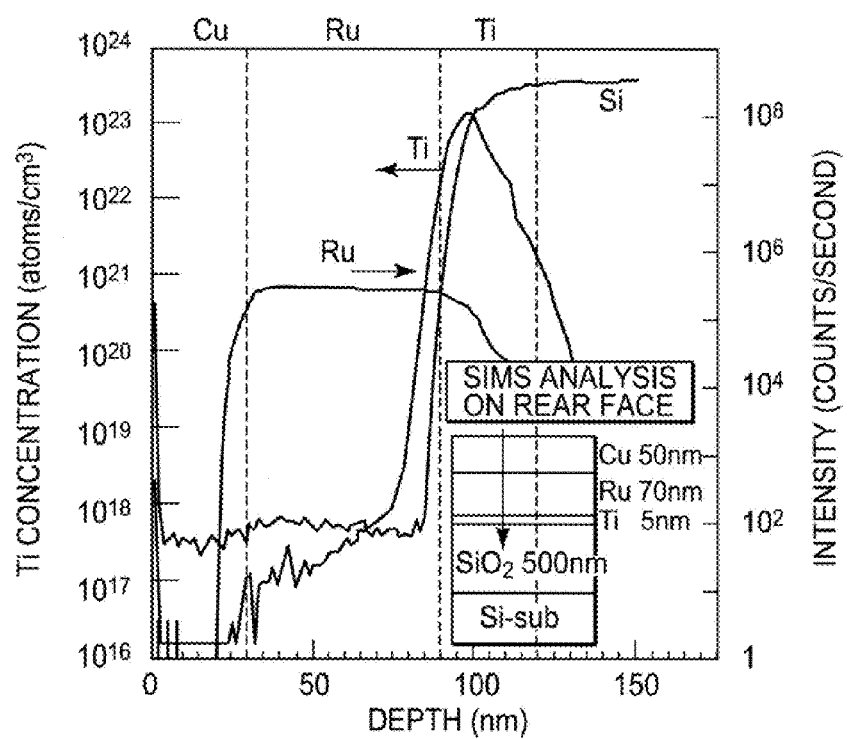
FIG. 19 is a graph showing a Ti concentration distribution in a Ru liner film of a multilayer film including a Ru liner and a Ti high-melting-point metal film according to the present invention.

FIG. 19 shows a Ti concentration distribution in the Ru liner film which was measured by an SIMS analysis. FIG. 19 shows a sample in which a Ru (70 nm)/Ti (5 nm) multilayer film was grown by sputtering, a Cu seed film of 50 nm was grown on the Ru/Ti multilayer film by a sputtering method, and annealing was conducted at 350° C. for three minutes. As apparent from FIG. 19, Ti diffused to Ru. Within an interface region inside of Ru by about 15 nm from the Ru/Ti interface, Ti drastically decreased from $1\times10^{22}$ (atom/cm$^2$) to $1\times10^{18}$ (atom/cm$^2$). In a region that is further away from the interface region, Ti had a distribution ranging from $1\times10^{17}$ to $1\times10^{18}$ (atom/cm$^2$).

Figure 20A:
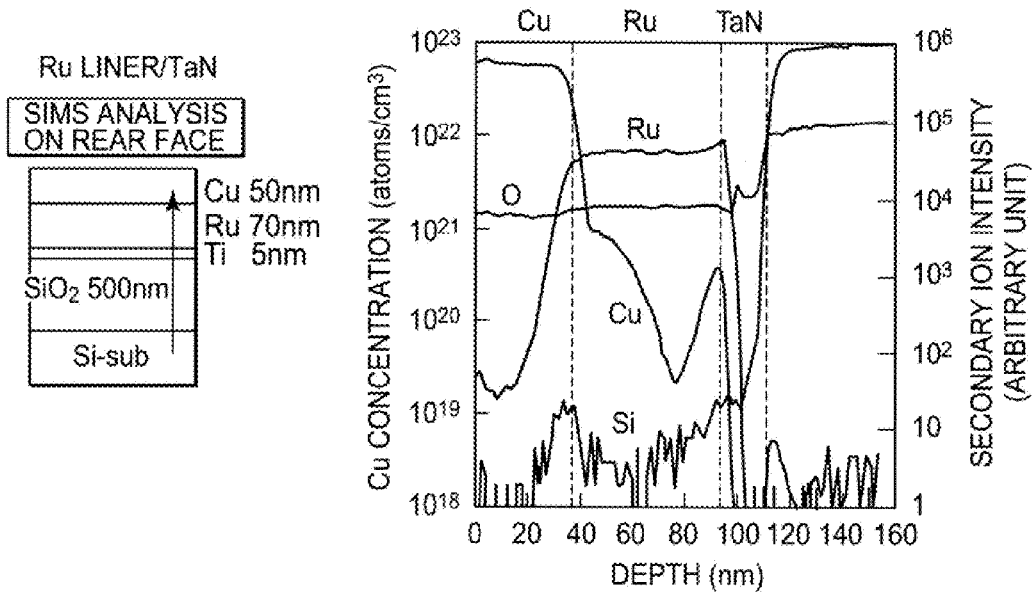
FIG. 20A is a graph showing a Cu concentration distribution in a Ru liner of a Cu/Ru/TaN multilayer film.
Figure 20B:
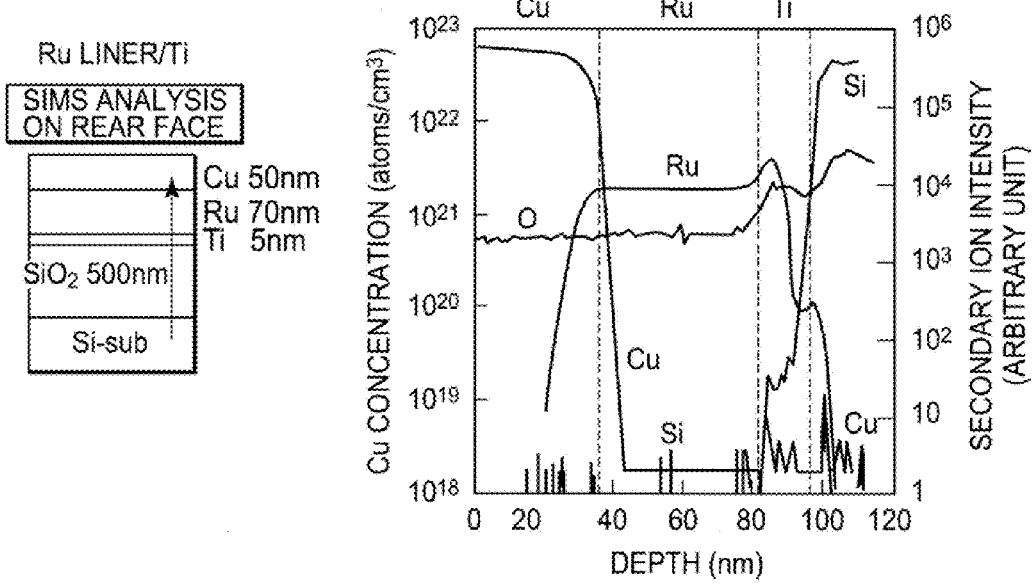
FIG. 20B is a graph showing a Cu concentration distribution in a Ru liner of a Cu/Ru/Ti multilayer film.

FIG. 20B shows results of measurement of a Cu concentration distribution which was measured by an SIMS analysis on a rear face of a sample, in which annealing was conducted on the aforementioned Cu/Ru(Ti)/Ti multilayer film at 350° C. for seven hours. FIG. 20A shows a case of a Cu/Ru/TaN multilayer film. It can be seen from FIG. 20A that Cu diffused to Ru and was blocked by the TaN film. That is, a pure Ru film does not have Cu diffusion barrier characteristics. On the other hand, the Cu/Ru(Ti)/Ti multilayer film did not exhibit diffusion of Cu to the Ru(Ti) film. As shown in FIG. 19, even in a case where the Ti solid solution concentration had some distribution in a highly-oriented (002)Ru film, there was no diffusion of Cu to Ru. This means that Cu diffusion barrier characteristics can sufficiently be maintained by solid solution of Ti in Ru at about $1\times10^{17}$ to $1\times10^{18}$ (atom/cm$^2$). Specifically, it can be seen that the Ru film was changed to have Cu barrier characteristics when Ti as the underlying high-melting-point metal film dissolved into the Ru liner film in a solid state. The Ti solid solution concentration should be at least about $1\times10^{17}$ to $1\times10^{18}$ (atom/cm$^2$).

Thus, in a case where a noble metal liner formed of Ru or the like is used, by using a material as an underlying high-melting-point metal that can dissolve in a noble metal in a solid state, such as Ti, the noble metal liner can be changed into a film having diffusion-proof barrier characteristics. In this example, Ti was used as the underlying high-melting-point metal film below the Ru liner. Nevertheless, the same advantages can also be obtained in a case of a Ti/TiN multi-layer film. The high-melting-point metal film that dissolves in Ru in a solid state may be formed of W, Ta, V, or Ni. Furthermore, it may be a TiW film or a TiW/TiWN multilayer film.

Figure 21:
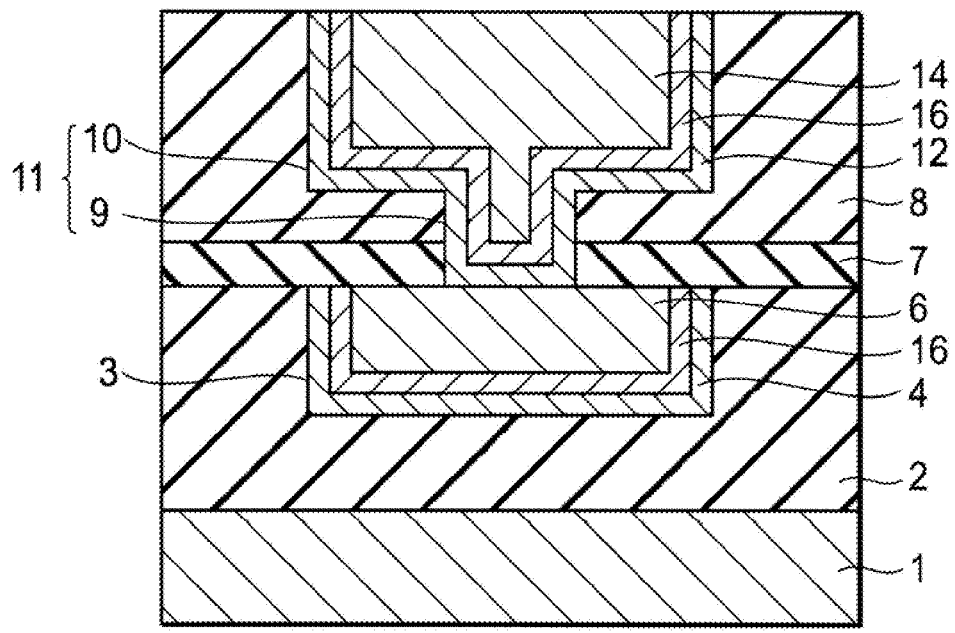
FIG. 21 is a cross-sectional view showing a copper multilayer interconnection using a noble metal alloy liner according to the present invention.
Figure 22:
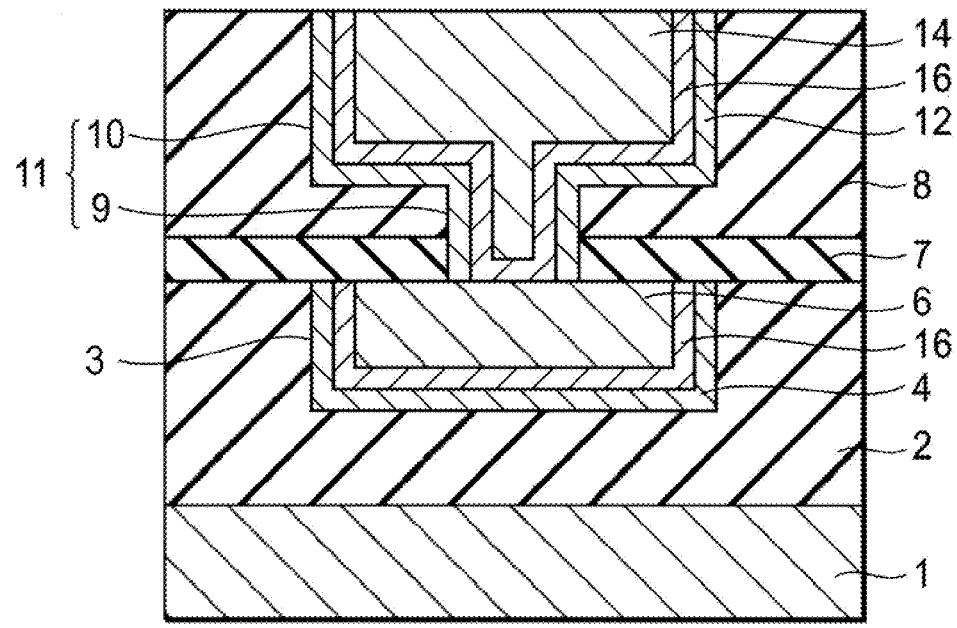
FIG. 22 is a cross-sectional view showing a copper multilayer interconnection using a noble metal alloy liner according to the present invention.

FIG. 21 shows a copper damascene interconnection using, as an underlying film, a high-melting-point metal that dissolves in a noble metal liner in a solid state. In this case, a Cu interconnection film is formed on a multilayer structure of an underlying high-melting-point metal film 12 and a noble metal alloy liner 16 containing a solid-soluble element as a principal component. More specifically, the high-melting-point metal film 12 is formed of Ti, and the noble metal alloy liner 16 is formed of Ru(Ti) having (002) orientation. Ti is excellent in adhesion to the insulating film of the copper interconnection. Ru(Ti) having (002) orientation is excellent in crystal conformity with Cu(111) and has diffusion-proof barrier characteristics to Cu. A Cu—Ti mixed layer is formed by direct contact of Ti with an underlying copper interconnection 6 at the bottom of the via. Therefore, a copper damascene multilayer interconnection is formed with remarkably excellent via reliability.

Next, a fourth embodiment of the present invention will be described with reference to FIG. 23.

A copper damascene interconnection structure in the fourth embodiment of the present invention uses, as underlying films, a first high-melting-point metal film 111 and a second high-melting-point metal film 113 that dissolve in a solid state into a first noble metal liner film 112 and a second noble metal liner film 114 on a semiconductor substrate 100, respectively. With this configuration, a principal component of the first high-melting-point metal film 111 and the second high-melting-point metal film 113 dissolves in a solid state in the first noble metal liner film 112 and the second noble metal liner film 114 formed thereon, respectively, and further diffuses respectively to a first copper interconnection film 103 and a second copper interconnection film 104 formed on the first noble metal liner film 112 and the second noble metal liner film 114.

As a result, a diffusion area 101 to which the principal component of the second high-melting-point metal film 113 has diffused is formed near a sidewall 115 and a bottom 116 of the second copper interconnection film 104 and near a sidewall 117 and a bottom 118 of the via 105. Furthermore, a diffusion area 106 to which the principal component of the first high-melting-point metal film 111 has diffused is formed near a sidewall 107 and a bottom 108 of the first copper interconnection film 103.

Moreover, the second high-melting-point metal film 113 is held in direct contact with a surface of the lower-layer first copper interconnection film 103 at a bottom 119 of the via. A diffusion area 102 to which the principal component of the second high-melting-point metal film 113 has diffused is formed within a certain distance from the surface of the first copper interconnection film 104. Thus, the diffusion area 102 is formed in contact with the via bottom 119 at an upper portion of the first copper interconnection film 103.

Here, the principal component of the first high-melting-point metal film 111 or the second high-melting-point metal film 113 diffuses to the diffusion area 102, which is formed at a portion of a surface of the first copper interconnection film 103, at a higher concentration as compared to the diffusion area 106, which is formed on the sidewall 107 and the bottom 108 of the first copper interconnection film 103, or the diffusion area 101, which is formed on the sidewall 115 and the bottom 116 of the second copper interconnection film 104.

Furthermore, the principal component of the first high-melting-point metal film 111 or the second high-melting-point metal film 113 precipitates on a portion of grain boundaries in the first copper interconnection film 103 or the second copper interconnection film 104.

Examples of this copper damascene interconnection structure include a structure using Ru as the noble metal liner films 112 and 114 and Ti as the high-melting-point metal films 111 and 113 that dissolve in the Ru liner in a solid state. In this case, a Cu/Ru/Ti structure is formed near the sidewall 115 and the bottom 116 of the second copper interconnection film 104 and near the sidewall 117 and the bottom 118 of the via 105 in FIG. 23.

Figure 24:
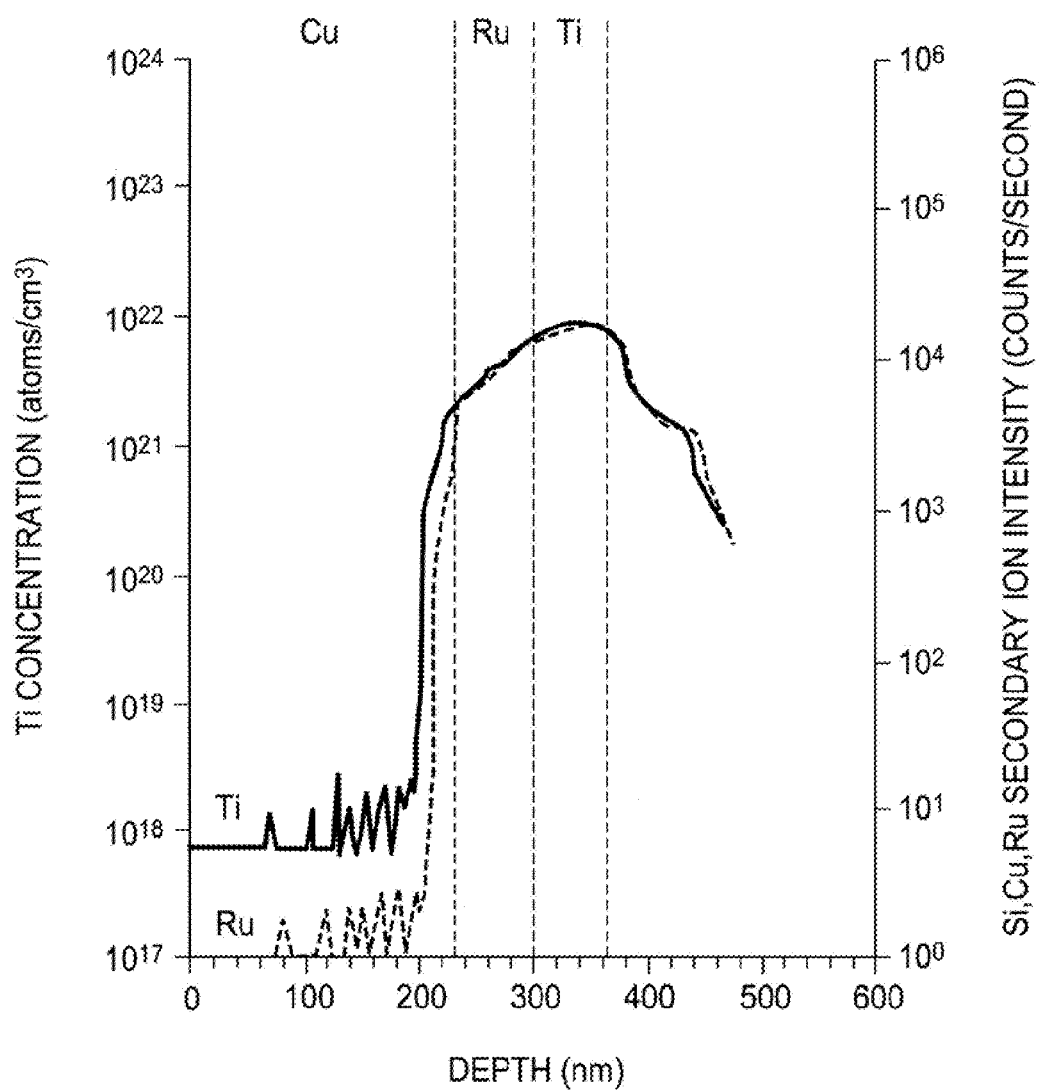
FIG. 24 is a graph showing SIMS results measuring diffusion of Ti into Cu in a Cu/Ru/Ti structure.

FIG. 24 shows SIMS results in which diffusion of Ti into Cu was observed in the Cu/Ru/Ti structure. As apparent from FIG. 24, Ti diffused to Cu. Within an interface region inside of Cu by about 200 nm from the Ru/Cu interface, the concentration of Ti drastically decreased approximately from $1\times10^{21}$ (atom/cm$^3$) to $1\times10^{18}$ (atom/cm$^3$).

Figure 23:
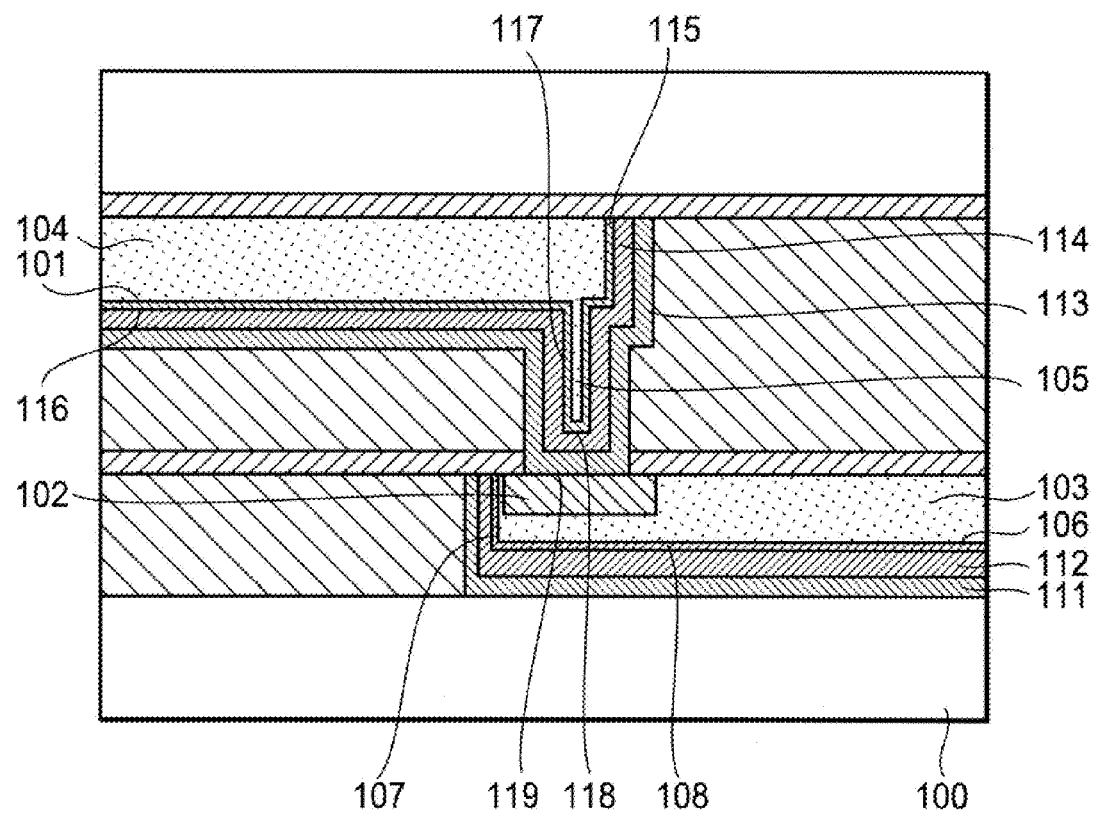
FIG. 23 is a cross-sectional view showing a multilayer interconnection structure of a semiconductor device according to a fourth embodiment of the present invention.
Figure 25:
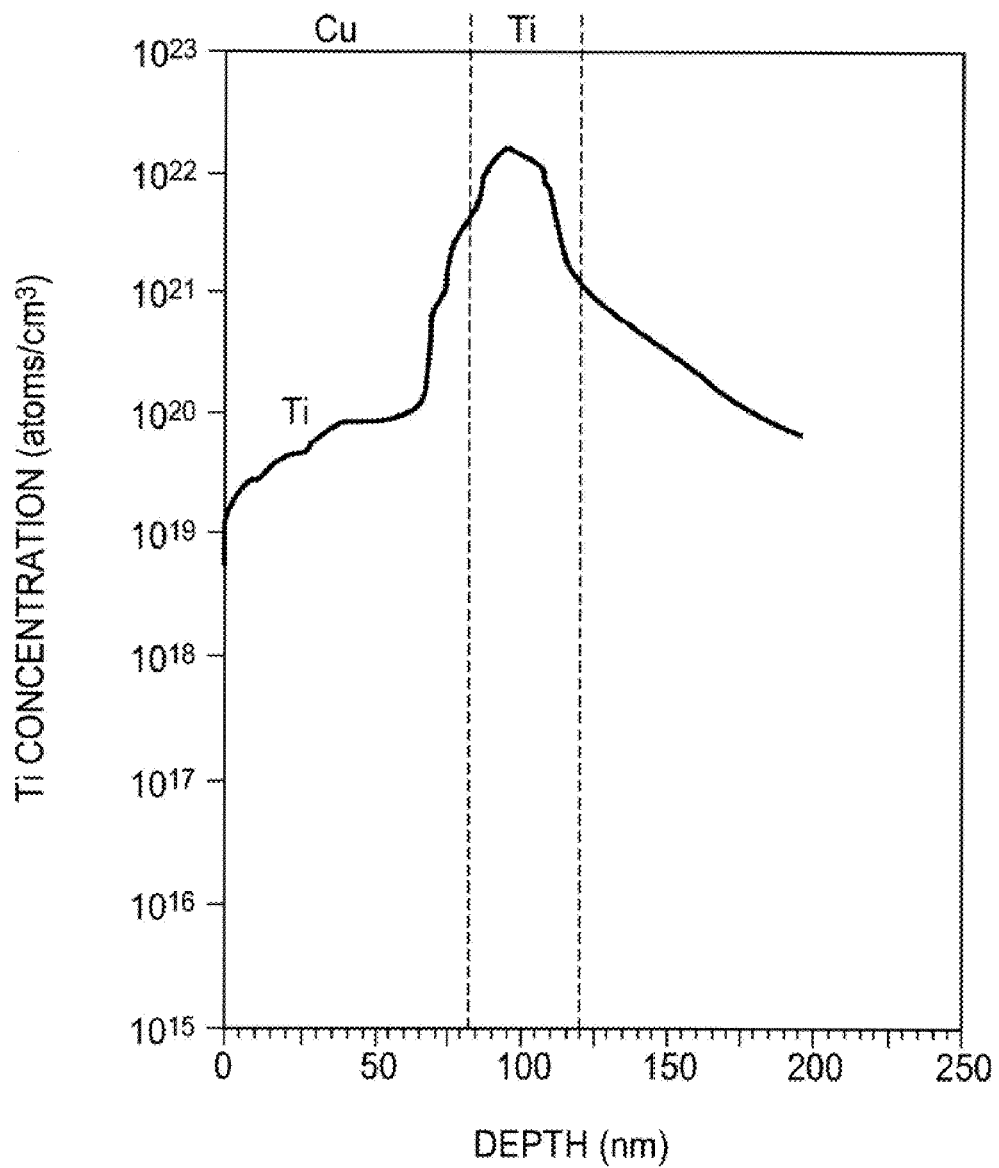
FIG. 25 is a graph showing SIMS results measuring diffusion of Ti into Cu in a Cu/Ti structure.

Meanwhile, a Cu/Ti structure is formed at a portion where the via bottom 119 is held in direct contact with the surface of the lower-layer first copper interconnection film 103 in FIG. 23. FIG. 25 shows SIMS results in which diffusion of Ti into Cu was observed in the Cu/Ti structure.

As apparent from. FIG. 25, Ti diffused into Cu. Within an interface region inside of Cu by about 100 nm from the bottom of Cu, the concentration of Ti decreased approximately from $1\times10^{22}$ (atom/cm$^3$) to $1\times10^{19}$ (atom/cm$^3$).

Figure 26:
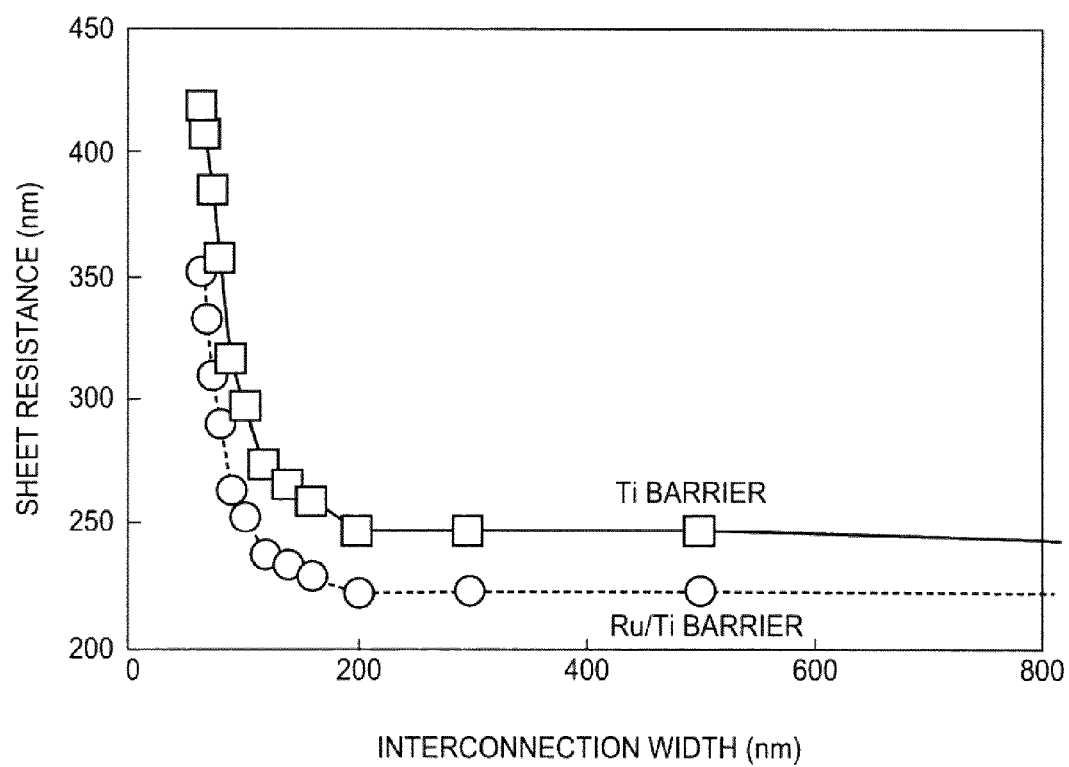
FIG. 26 is a graph showing results of comparison of the wiring resistance in an interconnection using a Cu/Ru/Ti structure, which is one of multilayer interconnection structures of a semiconductor device according to the fourth embodiment of the present invention, with an interconnection using a Cu/Ti structure.

FIG. 26 shows results of comparison of the wiring resistance of an interconnection using a Cu/Ru/Ti structure, which is one of interconnection structures according to the fourth embodiment of the present invention, with that of an interconnection using a Cu/Ti structure.

Actual interconnections were formed with use of a structure in which ruthenium having a thickness of 20 nm was formed on Ti (=5 nm) and with use of a structure of mere Ti. As a result, when the wiring resistance was compared between the Ti structure in which Ti was likely to diffuse into Cu and the Ru/Ti structure according to the present invention, it was confirmed that a difference in amount of diffusion of titanium to copper caused an increase of the wiring resistance in the Ti structure but no resistance increase in the Ru/Ti structure.

Figure 27:
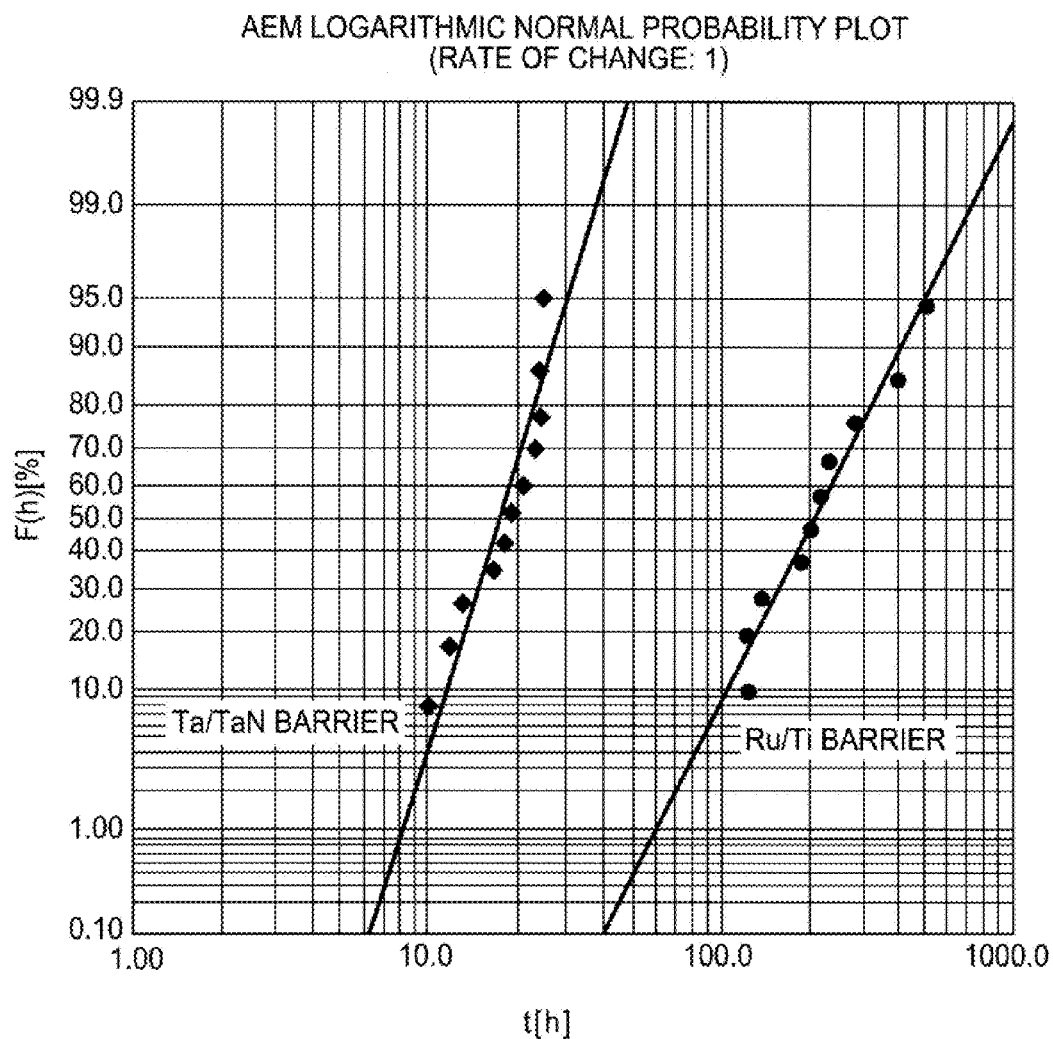
FIG. 27 is a graph showing results of comparison of the electromigration lifetime in an interconnection using a Cu/Ru/Ti structure, which is one of multilayer interconnection structures of a semiconductor device according to the fourth embodiment of the present invention, with an interconnection using a Cu/Ta/TaN structure.

Furthermore, FIG. 27 shows results of comparison of the electromigration lifetime of an interconnection using a Cu/Ru/Ti structure, which is one of interconnection structures according to the fourth embodiment of the present invention, with that of an interconnection using a Cu/Ta/TaN structure.

As shown in FIG. 27, when the EM reliabilities were compared, it was confirmed that the EM lifetime was improved as compared to the conventional Ta/TaN structure. As a result of failure analysis, it was confirmed that a rate of formation of voids near an interface between a via bottom and a lower-layer interconnection was lowered by using the Ru/Ti structure. It is conceivable that Ti diffused from the via bottom to the lower-layer interconnection to thereby improve the bonding strength between Ti and Cu so as to suppress the migration of Cu.

In view of the above discussion, an interconnection structure according to the fourth embodiment of the present invention is very effective in reduction of resistance and enhancement of reliability in an LSI.

The present invention is applicable to anything as long as it relates to an interconnection structure of a multilayer interconnection including an interconnection structure containing copper as a principal component and to a method of manufacturing such an interconnection structure. The present invention is never limited in applicability.

The aforementioned embodiments have been described by way of example. The present invention is never construed as being limited to those embodiments.

Industrial applicability

The present invention is applicable not only to a semiconductor device having a CMOS circuit, but also to a semiconductor product having a memory circuit such as a DRAM (Dynamic Random Access Memory), an SRAM (Static Random Access Memory), a flash memory, an FRAM (Ferro Electric Random Access Memory), an MRAM (Magnetic Random Access Memory), or a variable resistance memory, or a semiconductor product having a logic circuit such as a microprocessor, or a combination-type semiconductor product on which both of memory and logic circuits are mounted. Furthermore, the present invention is also applicable to a semiconductor device, an electronic circuit device, an optical circuit device, a quantum circuit device, a micromachine, and the like which have an embedded copper interconnection structure at least on a portion thereof.

The present application is the National Phase of PCT/JP2008/050309, filed Jan. 8, 2008, which is based upon Japanese patent application No 2007-2911, filed on Jan. 10, 2007, Japanese patent application No. 2007-144282, filed on May 30, 2007, and Japanese patent application No, 2007-293912, filed on Nov. 13, 2007, the disclosure of which is incorporated herein in its entirety by reference.

The invention claimed is:

1. A semiconductor device, comprising:
an insulating film formed on a semiconductor substrate,
an interconnection film containing copper as a principal component and being formed in a predetermined area in the insulating film, and
a liner film in contact with the interconnection film, the semiconductor device having a multilayer interconnection including at least one layer formed of the interconnection film,
wherein the interconnection film containing copper as a principal component is a polycrystalline film including crystal grains oriented to (111) in a substrate thickness direction, and
the liner film is a noble metal film having oxidation resistance under normal pressure and temperature and being oriented so as to have a close-packed orientation surface on its face,
wherein the liner film is a Ru film oriented so as to have a close-packed orientation surface on its face,
wherein crystal grains occupying 40% or more of an area of a unit interconnection surface among the crystal grains forming the polycrystal are oriented to (111) in a substrate thickness direction in case where the liner film is the Ru film, and a standard deviation of diameters of the crystal grains is 0.5 µm or less,
wherein a high-melting-point metal film is formed between the liner film and the insulating film, and
wherein the liner film is formed between the interconnection film and the high-melting-point metal film.

2. The semiconductor device as recited in claim 1, wherein the liner film is formed of the noble metal film having oxidation resistance under normal pressure and temperature at a via bottom of the multilayer interconnection, and the high-melting-point metal film is formed between the liner film and the insulating film at a portion other than the via bottom.

3. The semiconductor device as recited in claim 1, wherein the liner film contains C therein as an impurity at 100 ppm or less.

4. The semiconductor device as recited in claim 1, wherein the liner film contains, as an additive component, at least one element selected from the group consisting of Al, Pt, Pd, Ag, and Ni.

5. The semiconductor device as recited in claim 1, wherein the high-melting-point metal film contains, as a principal component, at least one element selected from the group consisting of Ta, Ti, W, Ru, Si, Mn, Zr, and Hf.

6. The semiconductor device as recited in claim 1, wherein a principal component of the high-melting-point metal film dissolves in at least a portion of the liner film in a solid state.

7. The semiconductor device as recited in claim 1, wherein a principal component of the high-melting-point metal film dissolves in an entire surface of the liner film in a solid state and diffuses to the interconnection film containing copper as a principal component.

8. The semiconductor device as recited in claim 1, wherein the high-melting-point metal film contains nitrogen.

9. The semiconductor device as recited in claim 1, wherein the high-melting-point metal film is amorphous.

10. The semiconductor device as recited in claim 1, wherein a metal of a principal component of the high-melting-point metal film selectively diffuses only to a sidewall, a bottom, or a portion of a surface of the interconnection film.

11. The semiconductor device as recited in claim 10, wherein the interconnection film is provided as a lower layer, and a portion of a surface of the interconnection film as the lower layer is located around a contact portion with a bottom of a via for connection with an upper layer of the interconnection film.

12. The semiconductor device as recited in claim 10, wherein the principal component of the high-melting-point metal film diffuses to the portion of the surface of the interconnection film at a higher concentration as compared to the sidewall or the bottom of the interconnection film.

13. The semiconductor device as recited in claim 10, wherein the principal component of the high-melting-point metal film precipitates on a portion of grain boundaries in the interconnection film.

14. A method of manufacturing a semiconductor device, comprising:
forming a trench and/or a via for an interconnection in a predetermined area of an insulating film formed on a semiconductor substrate;
forming a high-melting-point metal film on the insulating film having the trench and/or the via;
forming a noble metal film on the high-melting-point metal film under an atmosphere of 2 mTorr or less with a sputtering method; and
forming a film containing copper as a principal component on the noble metal film,
wherein the film containing copper is a polycrystalline film including crystal grains oriented to (111) in a substrate thickness direction,
wherein crystal grains occupying 40% or more of an area of a unit interconnection surface among the crystal grains forming the polycrystal are oriented to (111) in a substrate thickness direction in case where the noble metal film is a Ru film oriented so as to have a close-packed orientation surface on its face,
wherein the high-melting-point metal film is formed between the noble metal film and the insulating film, and
wherein the noble metal film is formed between the film containing copper and the high-melting-point metal film.

15. The method of manufacturing a semiconductor device as recited in claim 14, wherein the forming of the film containing copper as a principal component comprises a plating method to form the film containing copper as a principal component.

16. The method of manufacturing a semiconductor device as recited in claim 14, wherein the noble metal film contains, as an additive component, at least one element selected from the group consisting of Al, Pt, Pd, Ag, and Ni.

17. The method of manufacturing a semiconductor device as recited in claim 14, wherein the high-melting-point metal film contains, as a principal component, at least one element selected from the group consisting of Ta, Ti, W, Ru, Si, Mn, Zr, and Hf.

18. The method of manufacturing a semiconductor device as recited in claim 14, wherein the high-melting-point metal film contains nitrogen.

19. The method of manufacturing a semiconductor device as recited in claim 14, wherein the high-melting-point metal film is amorphous.

20. The method of manufacturing a semiconductor device as recited in claim 14, wherein only the high-melting-point metal at a bottom of the via is selectively removed by a re-sputtering method after forming the high-melting-point metal; and the noble metal film is then formed.

* * * * *